(12) United States Patent
Kim et al.

(10) Patent No.: US 11,929,389 B2
(45) Date of Patent: Mar. 12, 2024

(54) INTEGRATED CIRCUIT DEVICE

(71) Applicant: Samsung Electronics Co., Ltd., Suwon-si (KR)

(72) Inventors: Youn-soo Kim, Yongin-si (KR); Seung-min Ryu, Hwaseong-si (KR); Chang-su Woo, Seoul (KR); Hyung-suk Jung, Suwon-si (KR); Kyu-ho Cho, Seoul (KR); Youn-joung Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 239 days.

(21) Appl. No.: 17/324,492

(22) Filed: May 19, 2021

(65) Prior Publication Data

US 2021/0273039 A1    Sep. 2, 2021

Related U.S. Application Data

(63) Continuation of application No. 16/520,912, filed on Jul. 24, 2019, now Pat. No. 11,043,553.

(30) Foreign Application Priority Data

Sep. 19, 2018  (KR) ................. 10-2018-0112375

(51) Int. Cl.
*H01L 21/28*  (2006.01)
*H01L 49/02*  (2006.01)
*H10B 12/00*  (2023.01)

(52) U.S. Cl.
CPC .......... *H01L 28/40* (2013.01); *H10B 12/315* (2023.02)

(58) Field of Classification Search
CPC .................... H01L 28/40; H10B 12/315
See application file for complete search history.

(56) References Cited

U.S. PATENT DOCUMENTS 5,378,667 A    1/1995 Kim et al.
5,617,290 A    4/1997 Kulwicki et al.
(Continued)

FOREIGN PATENT DOCUMENTS

CN    107464807 A    12/2017
JP    H08-245263 A    9/1996
(Continued)

OTHER PUBLICATIONS

Zukerman, I. et al. "Segregation as a driving force in the formation of nanocomposite $ZrO_2$—$Al_2O_3$ coatings." *Surface & Coatings Technology* 314 (2017): 28-34.
(Continued)

*Primary Examiner* — Victor A Mandala
*Assistant Examiner* — Colleen E Snow
(74) *Attorney, Agent, or Firm* — Harness, Dickey & Pierce, P.L.C.

(57) ABSTRACT

An integrated circuit device includes a lower electrode, an upper electrode, and a dielectric layer structure between the lower electrode and the upper electrode, the dielectric layer structure including a first surface facing the lower electrode and a second surface facing the upper electrode. The dielectric layer structure includes a first dielectric layer including a first dielectric material and a plurality of grains extending from the first surface to the second surface and a second dielectric layer including a second dielectric material and surrounding a portion of a sidewall of each of the plurality of grains of the first dielectric layer in a level lower than the second surface. The second dielectric material includes a material having bandgap energy which is higher than bandgap energy of the first dielectric material.

13 Claims, 29 Drawing Sheets

(56) References Cited

U.S. PATENT DOCUMENTS

| | | | |
|---|---|---|---|
| 5,854,499 A | 12/1998 | Nishioka | |
| 7,112,819 B2 | 9/2006 | Matsui | |
| 7,323,422 B2 * | 1/2008 | Raaijmakers | H01L 28/56 |
| | | | 438/758 |
| 7,382,014 B2 | 6/2008 | Iijima | |
| 7,531,405 B2 | 5/2009 | Spitzer et al. | |
| 9,978,753 B2 | 5/2018 | Ahn et al. | |
| 2008/0093711 A1 | 4/2008 | Raaijmakers et al. | |
| 2014/0327062 A1 | 11/2014 | Park et al. | |
| 2016/0087028 A1 | 3/2016 | Hirota et al. | |
| 2020/0105633 A1 * | 4/2020 | Lee | H01L 28/40 |

FOREIGN PATENT DOCUMENTS

| | | |
|---|---|---|
| JP | H09017949 A | 1/1997 |
| JP | 2006-0324363 A | 11/2006 |
| KR | 10-1998-0065739 | 10/1998 |
| KR | 10-2014-0131142 A | 11/2014 |
| KR | 10-2017-0136826 A | 12/2017 |

OTHER PUBLICATIONS

Matsui, K., et al. "Low-temperature degradation in yttria-stablized tetragonal zirconia polycrystal doped with small amounts of alumina: Effect of grain-boundary energy" *Journal of the European Ceramic Society* 36 (2016): 155-162.

Non-Final Office Action dated Jul. 31, 2020 in U.S. Appl. No. 16/520,912.

Final Office Action dated Nov. 24, 2020 in U.S. Appl. No. 16/520,912.

Notice of Allowance dated Feb. 9, 2021 in U.S. Appl. No. 16/520,912.

First Office Action dated Jul. 15, 2023 in Chinese Application No. 201910822831.x.

* cited by examiner

COMPARATIVE EXAMPLE

INTEGRATED CIRCUIT DEVICE

CROSS-REFERENCE TO RELATED APPLICATIONS

This application is a Continuation of U.S. application Ser. No. 16/520,912, filed on Jul. 24, 2019, which claims the benefit of Korean Patent Application No. 10-2018-0112375, filed on Sep. 19, 2018, in the Korean Intellectual Property Office, the entire contents of each of which are incorporated herein by reference.

BACKGROUND

The inventive concepts relate to an integrated circuit device, and more particularly, to an integrated circuit device including a capacitor structure.

A size of a capacitor structure of a dynamic random access memory (DRAM) device has been reduced due to downscaling of a semiconductor device. As the size of the capacitor structure is reduced, a thickness of a capacitor dielectric layer is reduced, and due to this, a leakage current flowing through the capacitor dielectric layer increases.

SUMMARY

The inventive concepts provide an integrated circuit device which has a lower equivalent oxide thickness and includes a capacitor dielectric layer having a reduced leakage current.

According to an aspect of the inventive concepts, there is provided an integrated circuit device including a lower electrode, an upper electrode, and a dielectric layer structure between the lower electrode and the upper electrode, the dielectric layer structure including a first surface facing the lower electrode and a second surface facing the upper electrode, wherein the dielectric layer structure includes a first dielectric layer including a first dielectric material and a plurality of grains extending from the first surface to the second surface and a second dielectric layer including a second dielectric material and surrounding a portion of a sidewall of each of the plurality of grains of the first dielectric layer at a level lower than the second surface, and the second dielectric material includes a material having bandgap energy which is higher than bandgap energy of the first dielectric material.

According to another aspect of the inventive concepts, there is provided an integrated circuit device including a lower electrode, an upper electrode, and a dielectric layer structure between the lower electrode and the upper electrode, the dielectric layer structure including a first surface facing the lower electrode and a second surface facing the upper electrode, wherein the dielectric layer structure includes a first dielectric layer including a first dielectric material and a plurality of grains extending from the first surface to the second surface and a second dielectric layer including a second dielectric material differing from the first dielectric material and surrounding a portion of a sidewall of each of the plurality of grains of the first dielectric layer at a level lower than the second surface, the first dielectric layer has a first thickness in a first direction vertical to the first surface, and the second dielectric layer has a second thickness less than the first thickness in the first direction.

According to another aspect of the inventive concepts, there is provided an integrated circuit device including a lower electrode, an upper electrode, and a dielectric layer structure between the lower electrode and the upper electrode, the dielectric layer structure including a first surface facing the lower electrode and a second surface facing the upper electrode, wherein the dielectric layer structure includes a first dielectric layer including a first dielectric material and a plurality of grains extending from the first surface to the second surface and a second dielectric layer including a second dielectric material and surrounding a portion of a sidewall of each of the plurality of grains of the first dielectric layer at a level lower than the second surface, and the second dielectric material includes a material having a melting point lower than a melting point of the first dielectric material and having bandgap energy higher than bandgap energy of the first dielectric material.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EXAMPLE EMBODIMENTS

Hereinafter, example embodiments will be described in detail with reference to the accompanying drawings.

Figure 1:
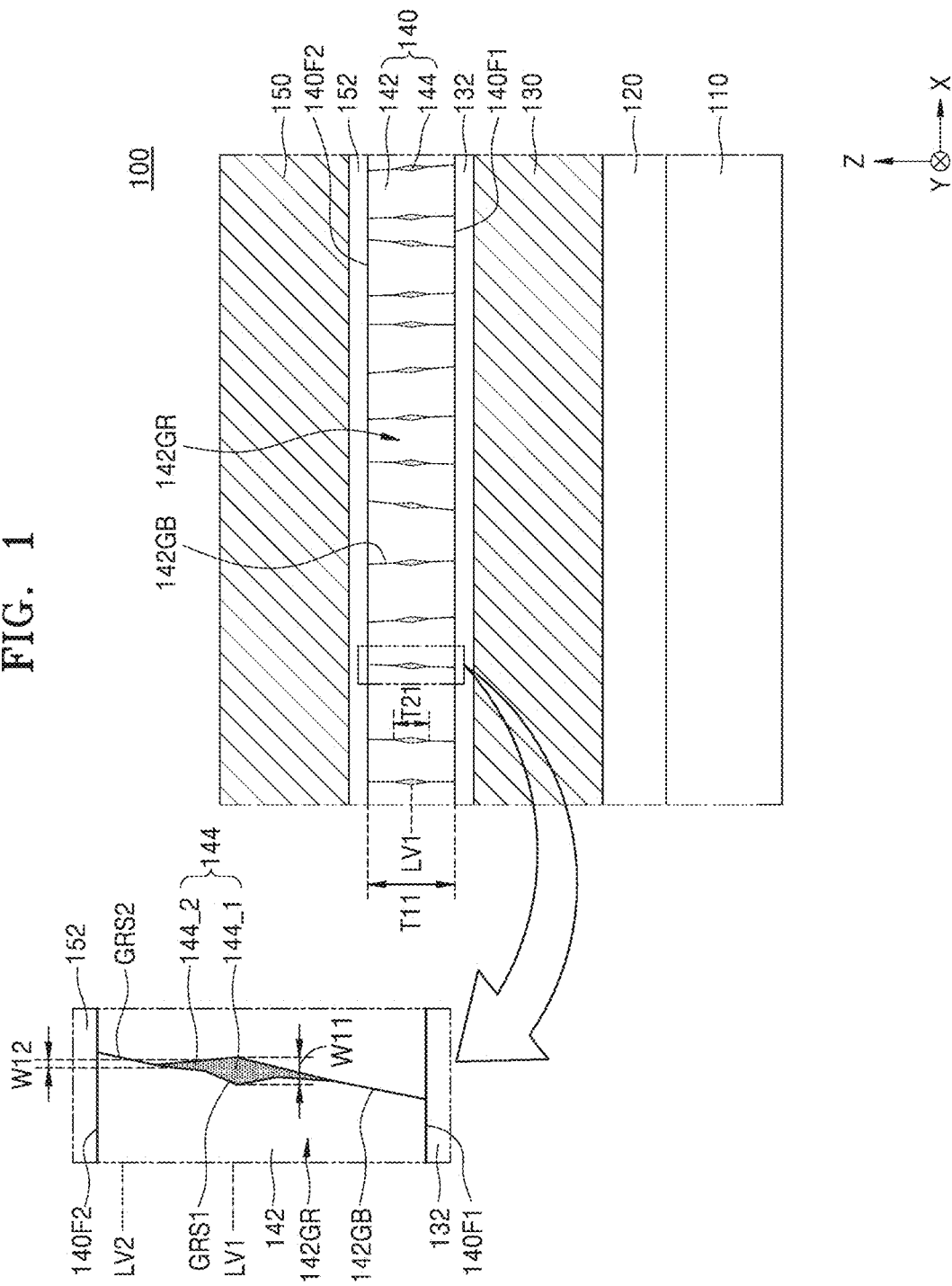
FIG. 1 is a cross-sectional view illustrating an integrated circuit device according to example embodiments.
Figure 2:
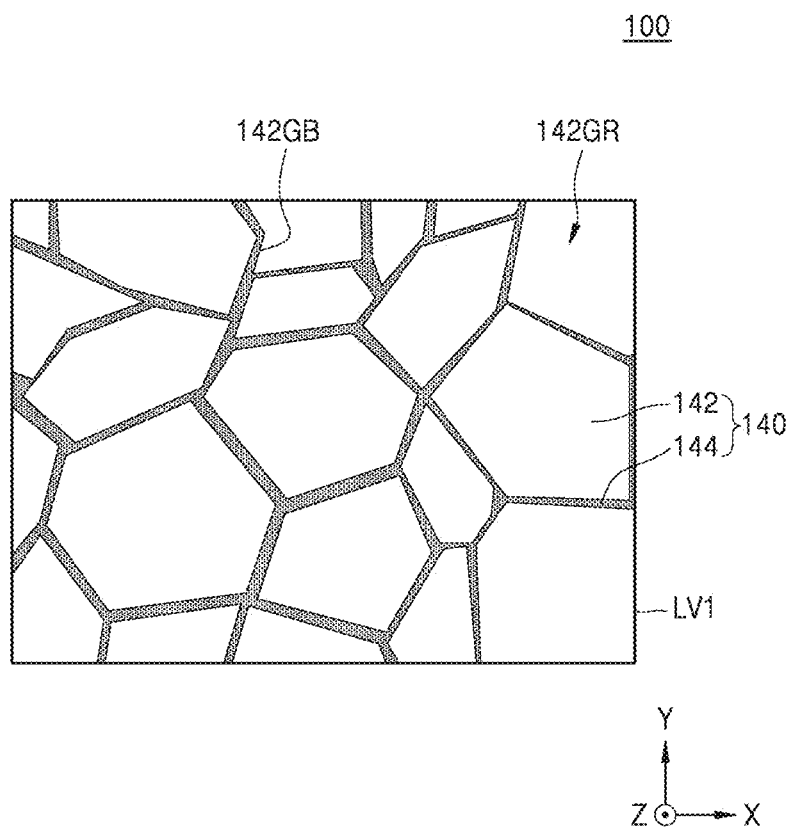
FIG. 2 is a horizontal cross-sectional view in a first vertical level of FIG. 1.

FIG. 1 is a cross-sectional view illustrating an integrated circuit device 100 according to example embodiments. FIG. 2 is a horizontal cross-sectional view in a first vertical level LV1 of FIG. 1.

Referring to FIGS. 1 and 2, the integrated circuit device 100 may include a substrate 110, an interlayer insulation layer 120, a lower electrode 130, a dielectric layer structure 140, and/or an upper electrode 150.

The substrate 110 may include a semiconductor material such as silicon (Si), germanium (Ge), silicon germanium (SiGe), silicon carbide (SiC), gallium arsenic (GaAs), indium arsenic (InAs), or indium phosphide (InP).

The interlayer insulation layer 120 may be disposed on the substrate 110. The interlayer insulation layer 120 may include silicon oxide, silicon nitride, silicon oxynitride, and/or the like. A wiring structure including a plurality of conductive layers and a plurality of insulation layers or a gate structure including a plurality of conductive layers and a plurality of insulation layers may be further provided on the substrate 110. The interlayer insulation layer 120 may be disposed to cover the wiring structure or the gate structure.

The lower electrode 130 may be disposed on the interlayer insulation layer 120. The lower electrode 130 may include at least one material selected from among metals such as ruthenium (Ru), titanium (Ti), tantalum (Ta), niobium (Nb), iridium (Ir), molybdenum (Mo), and tungsten (W), conductive metal nitrides such as titanium nitride (TiN), tantalum nitride (TaN), niobium nitride (NbN), molybdenum nitride (MoN), and tungsten nitride (WN), and conductive metal oxides such as iridium oxide ($IrO_2$), ruthenium oxide ($RuO_2$), and strontium ruthenium oxide ($SrRuO_2$).

In example embodiments, the lower electrode 130 may be formed as a single material layer or a stacked structure including a plurality of material layers. In an embodiment, the lower electrode 130 may be formed as a single layer including TiN or a single layer including NbN. In another embodiment, the lower electrode 130 may be formed in a stacked structure which includes a first lower electrode layer including TiN and a second lower electrode layer including NbN.

Optionally, a first interface layer 132 may be further formed on the lower electrode 130. The first interface layer 132 may include at least one of metal oxide such as titanium oxide, tantalum oxide, niobium oxide, molybdenum oxide, or iridium oxide, and metal oxynitride such as titanium oxynitride (TiON), tantalum oxynitride (TaON), niobium oxynitride (NbON), or molybdenum oxynitride (MoON). In example embodiments, the first interface layer 132 may include metal oxide of a metal material included in the lower electrode 130. For example, the first interface layer 132 may include metal oxide which is provided by performing an oxidization process on a surface of the lower electrode 130, but the inventive concepts are not limited thereto.

The dielectric structure 140 may be disposed on the first interface layer 132 and may include a first dielectric layer 142 and a second dielectric layer 144. The dielectric structure 140 may include a first surface 140F1 facing the lower electrode 130 and a second surface 140F2 facing the upper electrode 150.

The first dielectric layer 142 may include a plurality of grains 142GR, and the second dielectric layer 144 may be disposed to surround at least a portion of a sidewall of each of the plurality of grains 142GR at a grain boundary 142GB between the plurality of grains 142GR.

In example embodiments, the first dielectric layer 142 may include a first dielectric material. The first dielectric material may include a high-k material having a dielectric constant which is higher than that of silicon oxide. For example, the first dielectric material may include at least one of zirconium oxide, hafnium oxide, titanium oxide, niobium oxide, tantalum oxide, yttrium oxide, strontium titanium oxide, barium strontium titanium oxide, scandium oxide, and lanthanons oxide.

The second dielectric layer 144 may include a second dielectric material which is different from the first dielectric material, and the second dielectric material may include metal oxide having bandgap energy, which is higher than that of the first dielectric material. The second dielectric material may have bandgap energy (Eg) of about 5 eV to about 10 eV and may have a dielectric constant of about 3.9 to about 40. Also, the second dielectric material may include metal oxide having a melting point (Tm) which is lower than that of the first dielectric material. For example, the second dielectric material may include at least one of boron oxide ($B_2O_3$), aluminium oxide ($Al_2O_3$), gallium oxide ($Ga_2O_3$), and indium oxide ($In_2O_3$).

The first dielectric layer 142 may have a first thickness T11 in a direction vertical to an upper surface of the lower electrode 130, and the first thickness T11 of the first dielectric layer 142 may be about 20 Å to about 100 Å. However, example embodiments are not limited thereto. FIG. 1 illustrates that the upper surface of the lower electrode 130 extends in a direction parallel to an upper surface of the substrate 110 and a direction vertical to the upper surface of the lower electrode 130 is a vertical direction (a Z direction), but example embodiments are not limited thereto. In other embodiments, the lower electrode 130 may extend in a direction vertical to the upper surface of the substrate 110, and in this case, the first dielectric layer 142 may have the first thickness T11 in a direction parallel to the upper surface of the substrate 110.

The plurality of grains 142GR may extend in the vertical direction (the Z direction) on the first interface layer 132 and may extend over a total thickness T11 of the first dielectric layer 142. That is, the plurality of grains 142GR may have a bamboo-structured microstructure, and each of the plurality of grains 142GR may have a thickness which is substantially the same as or similar to the thickness T11 of the first dielectric layer 142. Here, the bamboo-structured microstructure refers to a columnar microstructure, in which a large portion of grains are aligned substantially in one direction on an underlying layer, and each of the grains has a columnar shape extending substantially in one direction.

The second dielectric layer 144 may have a second thickness T21 which is less than the first thickness T11 of the first dielectric layer 142. As illustrated in FIG. 1, the second dielectric layer 144 may extend from a portion of the grain boundary 142GB of the first dielectric layer 142 in the vertical direction (the Z direction). Also, the second dielectric layer 144 may not be exposed at the first surface 140F1 and the second surface 140F2 of the dielectric structure 140. As illustrated in FIG. 2, in a horizontal cross-sectional view in the first vertical level LV1, the second dielectric layer 144 may be disposed to surround each of the plurality of grains 142GR. The second dielectric layer 144 may fill a space between two adjacently disposed grains 142GR of the plurality of grains 142GR and may have a net-shaped horizontal cross-section. The first vertical level LV1 may denote an arbitrary level which is higher than a first surface 140F1 level of the dielectric structure 140 and is lower than a second surface 140F2 level of the dielectric structure 140.

As illustrated in an enlarged portion of the example of FIG. 1, the second dielectric layer 144 may include a first portion 144_1 in the first vertical level LV1 and a second portion 144_2 which is disposed closer to the second surface 140F2 than the first portion 144_1 is. The first portion 144_1 may have a first width W11 in a horizontal direction (an X direction), and the second portion 144_2 may have a second width W12 smaller than the first width W11 in the horizontal direction (the X direction). Also, each of the plurality of grains 142GR may include a first sidewall GRS1 disposed in the first vertical level LV1 and a second sidewall GRS2 disposed in a second vertical level LV2, which is higher than the first vertical level LV1. The first sidewall GRS1 may be surrounded by the second dielectric layer 144 or may contact the second dielectric layer 144, and the second sidewall GRS2 may contact one or more of the plurality of grains 142GR.

The second dielectric layer 144 may include a material having bandgap energy, which is higher than that of the first dielectric layer 142, and thus, may act as a barrier where the second dielectric layer 144 blocks a path of a leakage current flowing through the grain boundary 142GB even when the first dielectric layer 142 includes a grain 142GR extending along a total thickness thereof.

Figure 12A:
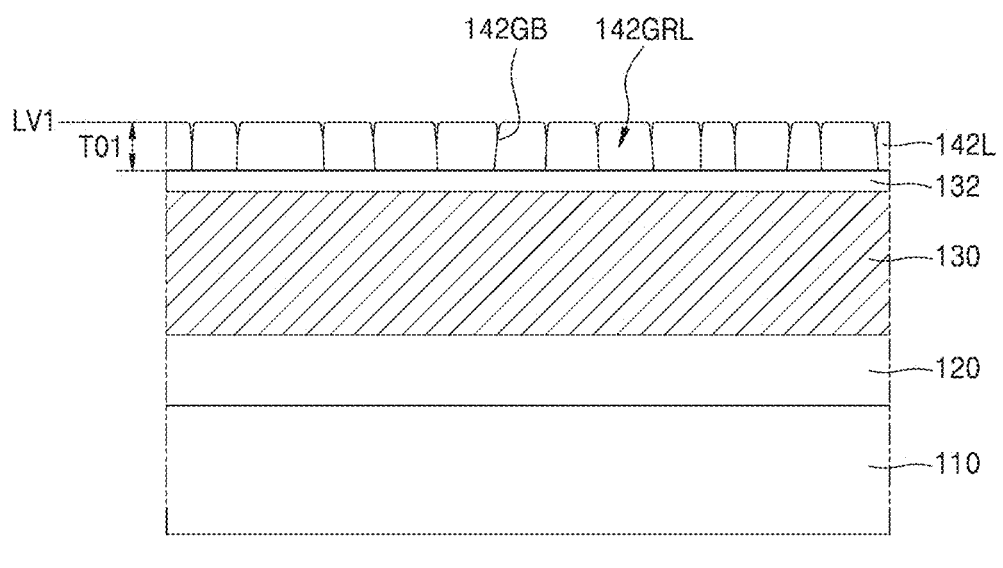
FIGS. 12A to 12D are cross-sectional views illustrating a method of manufacturing an integrated circuit device in a process sequence, according to example embodiments.
Figure 12B:
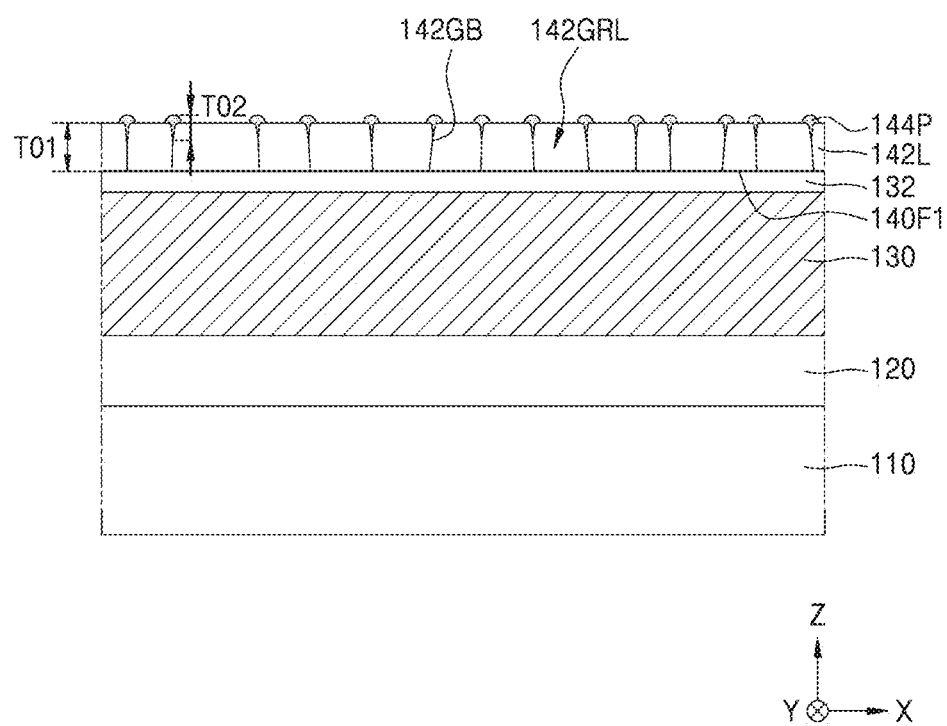
Figure 12C:
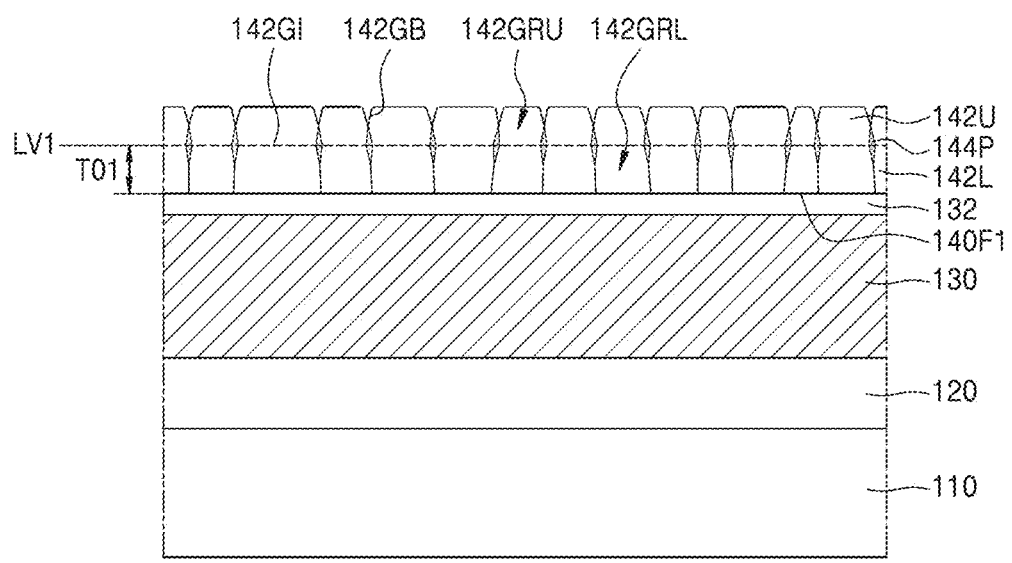

In example embodiments, the first dielectric layer 142 may be formed by sequentially forming a lower first dielectric layer 142L (see FIG. 12C) and an upper first dielectric layer 142U (see FIG. 12C). For example, a grain 142GRU of the upper first dielectric layer 142U may grow from a grain 142GRL of the lower first dielectric layer 142L, and the grain 142GRU of the upper first dielectric layer 142U may be formed to have the same crystalline phase as that of the grain 142GRL of the lower first dielectric layer 142L by using the lower first dielectric layer 142L as a crystallization seed layer. For example, when the lower first dielectric layer 142L includes zirconium oxide having a tetragonal crystalline phase, the upper first dielectric layer 142U may be formed to have a tetragonal crystalline phase.

In example embodiments, a preliminary second dielectric layer 144P (see FIG. 12B) may be formed after the lower first dielectric layer 142L is formed and before the upper first dielectric layer 142U is formed, and the preliminary second dielectric layer 144P may be relatively easily diffused and repositioned through the grain boundary 142GB in a process of forming the upper first dielectric layer 142U. The preliminary second dielectric layer 144P may be diffused and repositioned to surround the grain 142GRL of the lower first dielectric layer 142L and the grain 142GRU of the upper first dielectric layer 142U. For example, the grain 142GR of the first dielectric layer 142 having one crystalline direction may be formed by connecting the grain 142GRL of the lower first dielectric layer 142L to the grain 142GRU of the upper first dielectric layer 142U, and the second dielectric layer 144 may surround at least a portion of a sidewall of the grain 142GR of the first dielectric layer 142.

The upper electrode 150 may be disposed on the dielectric structure 140. The upper electrode 150 may include at least one material selected from among metals such as ruthenium (Ru), titanium (Ti), tantalum (Ta), niobium (Nb), iridium (Jr), molybdenum (Mo), and tungsten (W), conductive metal nitrides such as titanium nitride (TiN), tantalum nitride (TaN), niobium nitride (NbN), molybdenum nitride (MoN), and tungsten nitride (WN), and conductive metal oxides such as iridium oxide ($IrO_2$), ruthenium oxide ($RuO_2$), and strontium ruthenium oxide ($SrRuO_2$).

In example embodiments, the upper electrode 150 may be formed as a single material layer or in a stacked structure including a plurality of material layers. In an embodiment, the upper electrode 150 may be formed as a single layer including TiN or a single layer including NbN. In another embodiment, the upper electrode 150 may be formed in a stacked structure which includes a first upper electrode layer including TiN and a second upper electrode layer including NbN.

Optionally, a second interface layer 152 may be further formed between the dielectric layer structure 140 and the upper electrode 150. The second interface layer 152 may include at least one of metal oxide such as titanium oxide, tantalum oxide, niobium oxide, molybdenum oxide, or iridium oxide, and metal oxynitride such as titanium oxynitride (TiON), tantalum oxynitride (TaON), niobium oxynitride (NbON), or molybdenum oxynitride (MoON).

Hereinafter, a capacitance model of the dielectric layer structure 140 will be described with reference to FIGS. 1, 19A, and 19B.

Figure 19A:
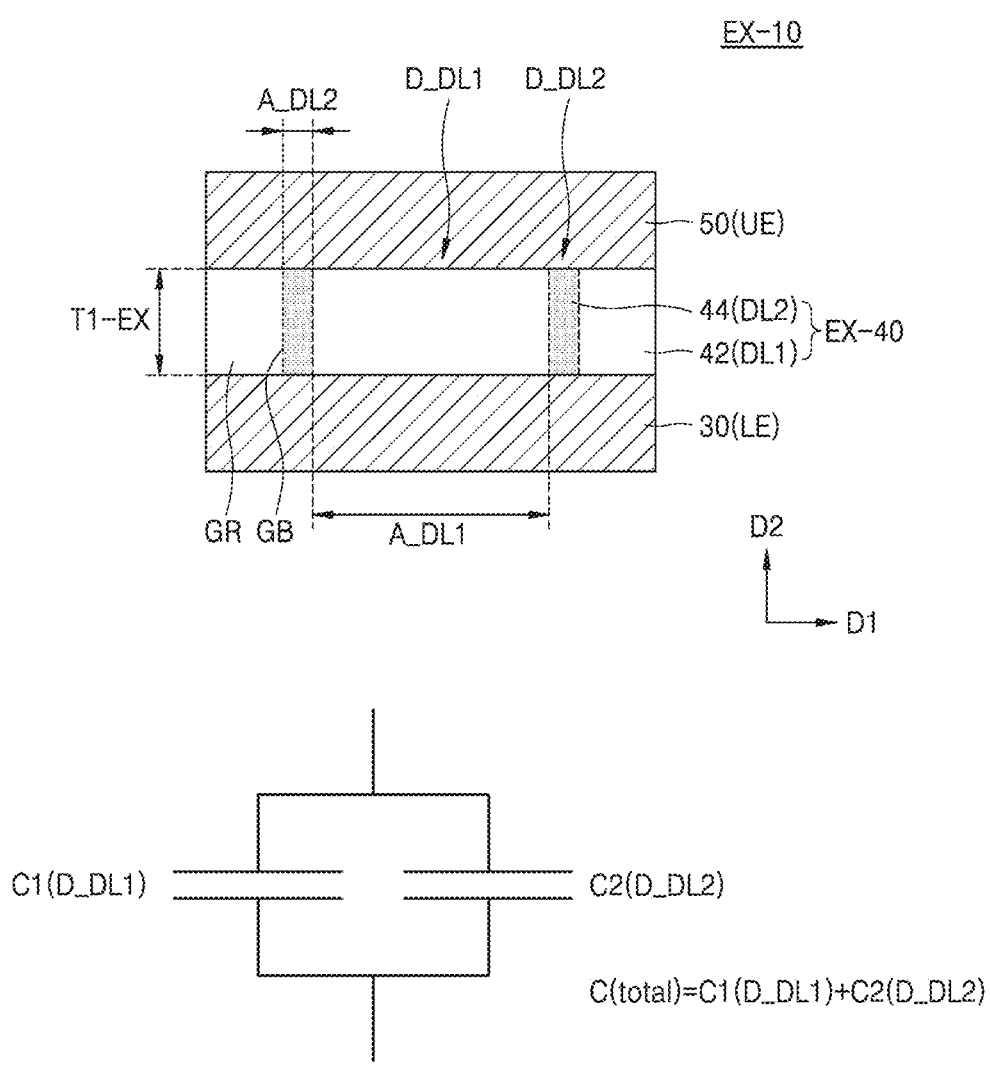
FIG. 19A is a schematic view and an equivalent circuit diagram of a capacitor structure according to example embodiments.

FIG. 19A is a cross-sectional view and an equivalent circuit diagram of an example capacitor structure EX-10 according to example embodiments as described above with reference to FIG. 1.

For example, as illustrated in FIG. 19A, an example dielectric layer structure EX-40 may include a first dielectric layer 42 (DL1) and a second dielectric layer 44 (DL2). The first dielectric layer 42 (DL1) may include a plurality of grains GR which extend in a second direction (e.g., a D2 direction) vertical to an upper surface of a lower electrode 30 (LE), and the second dielectric layer 44 (DL2) may have a certain width at a grain boundary GB of the first dielectric layer 42 (DL1) and may extend in the second direction (the D2 direction). In example embodiments, a portion of the second dielectric layer 44 (DL2) disposed between the lower electrode 30 (LE) and an upper electrode 50 (UE) may act as a capacitor dielectric layer of the example capacitor structure EX-10. Accordingly, the example capacitor structure EX-10 may represent a capacitance caused by the second dielectric layer 44 (DL2) as well as a capacitance caused by the first dielectric layer 42 (DL1).

For example, grains GR of the first dielectric layer 42 (DL1) may configure a first sub-capacitor domain D_DL1 between the upper electrode 50 (UE) and the lower electrode 30 (LE), and grains GR of the second dielectric layer 44 (DL2) may configure a second sub-capacitor domain D_DL2 between the upper electrode 50 (UE) and the lower electrode 30 (LE). Also, an area A DL2 of the second dielectric layer 44 (DL2) contacting the upper electrode 50 (UE) or the lower electrode 30 (LE) and an area A DL1 of the first dielectric layer 42 (DL1) contacting the upper electrode 50 (UE) or the lower electrode 30 (LE) may each be obtained.

As seen in an equivalent circuit diagram illustrated in a lower portion of FIG. 19A, the first sub-capacitor domain D_DL1 may be connected to the second sub-capacitor domain D_DL2 in parallel, and thus, a total capacitance C(total) of the capacitor structure EX-10 may be a sum of a first capacitance C1(D_DL1) obtained from the first sub-capacitor domain D_DL1 and a second capacitance C2(D_DL2) obtained from the second sub-capacitor domain D_DL2 (in other words, C(total)=C1(D_DL1)+C2(D_DL2)).

Figure 19B:
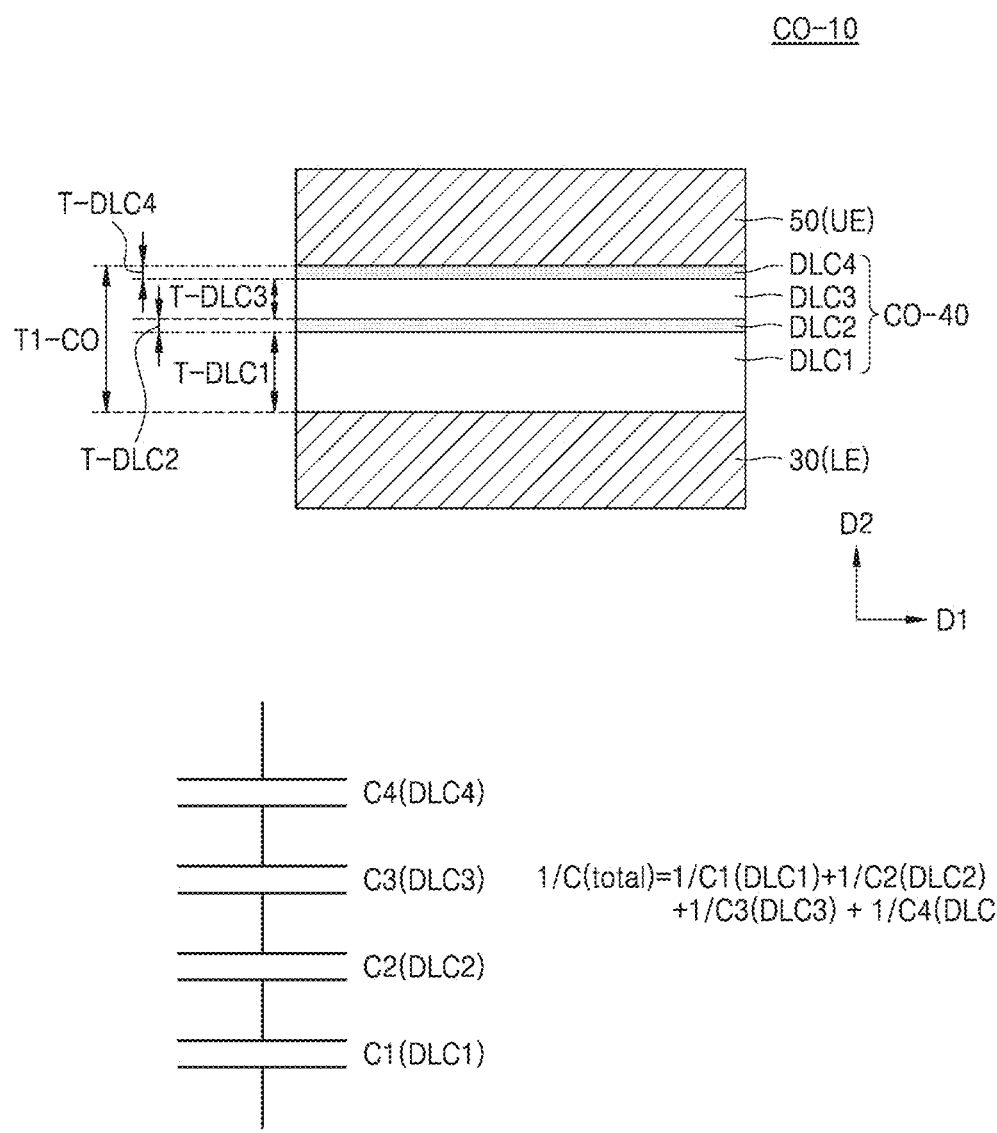
FIG. 19B is a schematic view and an equivalent circuit diagram of a capacitor structure according to a comparative example.

FIG. 19B is a cross-sectional view and an equivalent circuit diagram of a capacitor structure CO-10 according to a comparative example.

For example, as illustrated in FIG. 19B, the capacitor structure CO-10 according to the comparative example may include a dielectric layer structure CO-40 disposed between a lower electrode 30 (LE) and an upper electrode 50 (UE), and the dielectric layer structure CO-40 may include a first dielectric layer DLC1, a second dielectric layer DLC2, a third dielectric layer DLC3, and a fourth dielectric layer DLC4, which are sequentially stacked on the lower electrode 30 (LE). The first dielectric layer DLC1 and the third dielectric layer DLC3 may each include a first dielectric material, and the second dielectric layer DLC2 and the fourth dielectric layer DLC4 may each include a second dielectric material having bandgap energy, which is higher than that of the first dielectric material. Each of the layers of the dielectric layer structure CO-40 may be conformally disposed on the lower electrode 30 (LE) to have a certain thickness and may extend in a first direction (a D1 direction).

As seen in an equivalent circuit diagram illustrated in the lower portion of FIG. 19A, in the capacitor structure CO-10 according to the comparative example, the first dielectric layer DLC1, the second dielectric layer DLC2, the third dielectric layer DLC3, and the fourth dielectric layer DLC4 may respectively correspond to first to fourth capacitors serially connected to one another. Accordingly, a total capacitance C(total) of the capacitor structure CO-10 may be determined based on the following Equation (1):

$$1/C(\text{total})=1/C1(DLC1)+1/C2(DLC2)+1/C3(DLC3)+1/C4(DLC4) \quad (1)$$

According to Equation (1), the total capacitance C(total) of the capacitor structure CO-according to the comparative example may be determined based on a dielectric constant and a thickness of each of the layers of the dielectric layer structure CO-40.

It is desirable that a thickness of each of the layers of the dielectric layer structure CO-40 is reduced as a thickness T1-CO of the dielectric layer structure CO-40 is decreased by downscaling of a semiconductor device. Generally, a thickness T-DLC1 of the first dielectric layer DLC1 may be relatively large, and a crystallinity of the first dielectric layer DLC1 may be good. However, when the third dielectric layer DLC3 is formed to have a thickness T-DLC3 equal to or less than a critical thickness in order to reduce a total thickness T1-CO of the dielectric layer structure CO-40 according to the comparative example, the third dielectric layer DLC3 may be formed to have a relatively lower crystallinity (for example, to have an amorphous structure). For example, when the third dielectric layer DLC3 includes zirconium oxide ($ZrO_2$), a dielectric constant of amorphous zirconium oxide may be less than a dielectric constant of crystalline zirconium oxide by about 30%. Therefore, as the total thickness T1-CO of the capacitor structure CO-10 is reduced, the total capacitance C(total) of the capacitor structure CO-10 may be further reduced.

On the contrary, in the capacitor structure EX-10 according to embodiments, the second dielectric layer 44 (DL2) may be disposed to surround the grains GR of the first dielectric layer 42 (DL1), and thus, the first dielectric layer 42 (DL1) may be formed to have the same thickness as a total thickness T1-EX of the dielectric layer structure EX-40. Accordingly, a crystallinity of the first dielectric layer 42 (DL1) may not be reduced, or may not have an amorphous structure. The first dielectric layer 42 (DL1) may be formed to have a crystalline structure, and thus, the capacitor structure EX-40 may have a relatively large capacitance even when the total thickness T1-EX of the dielectric layer structure EX-40 is decreased.

It has been confirmed that, as a result obtained by performing an arithmetic operation on the dielectric structure EX 40 having a small thickness T1-EX of about 100 Å or less by using zirconium oxide as the first dielectric layer 42 (DL1) and using aluminium oxide as the second dielectric layer 44 (DL2), an equivalent oxide thickness of about 5 Å is reduced compared to the dielectric layer structure CO-40 according to the comparative example. Such as a result has been confirmed based on an experiment result of FIG. 20.

Figure 20:
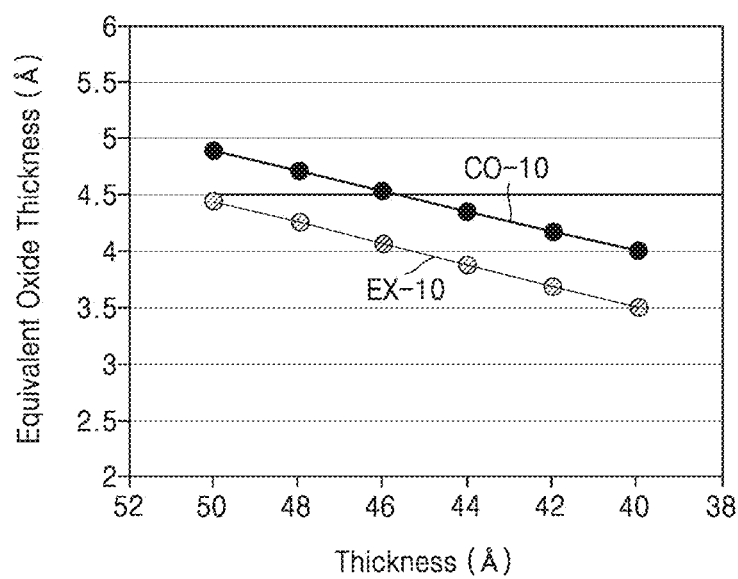
FIG. 20 is a graph showing an equivalent oxide thickness (A) with respect to a thickness (A) of a dielectric layer structure of a capacitor structure according to example embodiments.

FIG. 20 is a graph showing an equivalent oxide thickness (A) with respect to a thickness (A) of a dielectric layer structure of a capacitor structure according to example embodiments. An equivalent oxide thickness (A) of the capacitor structure CO-10 according to the comparison example described above with reference to FIG. 19B is shown together for comparison.

Referring to FIG. 20, it has been confirmed that the capacitor structure EX-10 according to example embodiments may have an equivalent oxide thickness which is smaller than that of the capacitor structure CO-10 according to the comparison example. It may be considered that this is based on a high crystallinity of the first dielectric layer 42 (DL1) described above with reference to FIGS. 19A and 19B.

Referring again to FIG. 1, although the integrated circuit device 100 according to example embodiments includes the dielectric layer structure 140 having a relatively thin thickness, the dielectric layer structure 140 may have an equivalent oxide thickness which is relatively small compared to a good crystallinity of the first dielectric layer 142 and may have a reduced leakage current.

Figure 3:
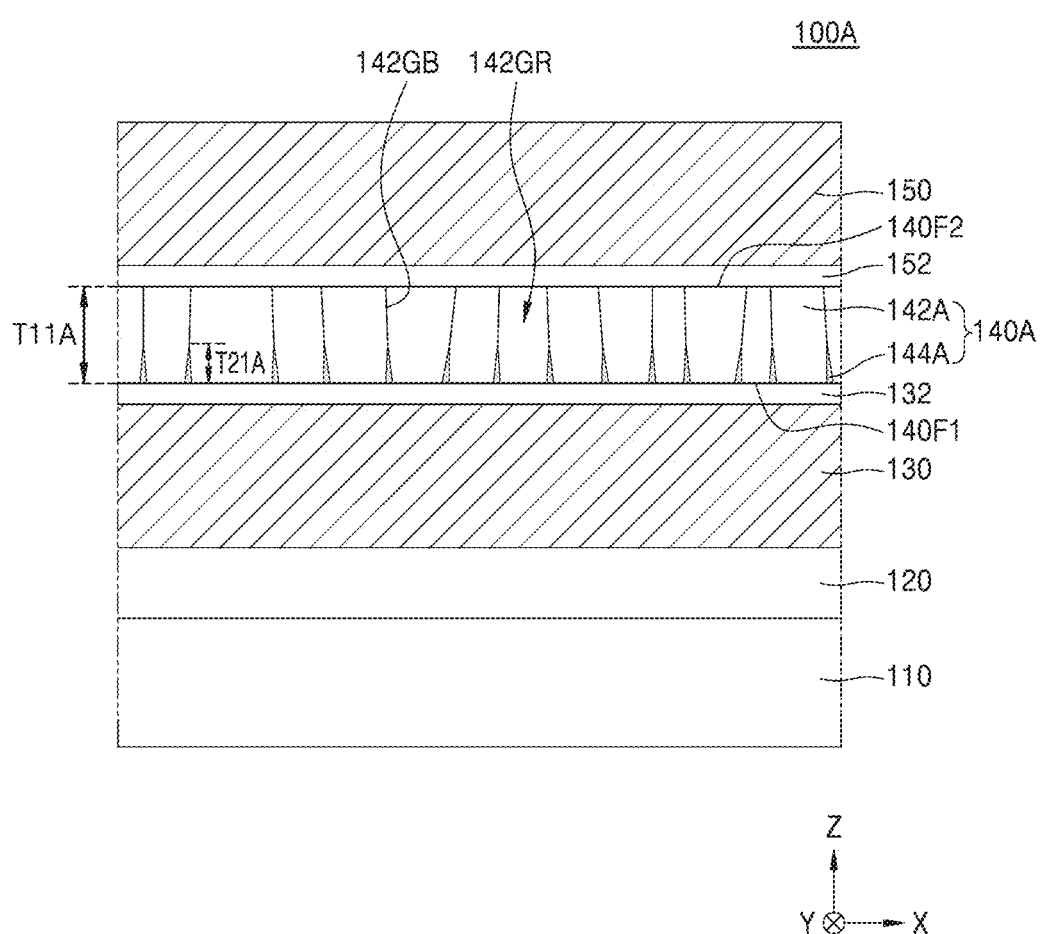
FIG. 3 is a cross-sectional view illustrating an integrated circuit device according to example embodiments.

FIG. 3 is a cross-sectional view illustrating an integrated circuit device 100A according to example embodiments. In FIGS. 1 to 3, like reference numbers refer to like elements. Except for a configuration of a dielectric layer structure 140A, the integrated circuit device 100A is the same as the integrated circuit device 100 described above with reference to FIG. 2, and thus, differences therebetween will be mainly described.

Referring to FIG. 3, the dielectric layer structure 140A may include a first dielectric layer 142A and a second dielectric layer 144A. The dielectric layer structure 140A may include a first surface 140F1 facing a lower electrode 130 and a second surface 140F2 facing an upper electrode 150. The first dielectric layer 142A may include a plurality of grains 142GR which extend from the first surface 140F1 to the second surface 140F2 and extend over a total first thickness T11A of the dielectric layer structure 140A. The second dielectric layer 144A may surround a lower portion of each of the grains 142GR of the first dielectric layer 142A. For example, as illustrated in FIG. 3, the second dielectric layer 144A may have a second thickness T21A from the first surface 140F1 to surround the plurality of grains 142GR and may be exposed at the first surface 140F1 to contact a first interface layer 132.

In example embodiments, a preliminary second dielectric layer 144PA (see FIG. 14A) may be formed on the lower electrode 130, and the first dielectric layer 142A may be formed on the preliminary second dielectric layer 144PA, thereby forming the dielectric layer structure 140A. The preliminary second dielectric layer 144PA may be easily diffused and repositioned along the grain boundary 142GB of the first dielectric layer 142A in a process of forming the first dielectric layer 142A, and thus, the second dielectric layer 144A may be disposed to surround a lower portion of the grain boundary 142GB of the first dielectric layer 142A.

The second dielectric layer 144A may be formed to have a certain thickness T21A from the first surface 140F1 of the dielectric layer structure 140A and to surround a sidewall of each of the grains GR of the first dielectric layer 142A, and thus, content of the second dielectric layer 144A included in the dielectric layer structure 140A may be relatively reduced. Accordingly, the second dielectric layer 144A may have an equivalent oxide thickness which is relatively small and effectively blocks a path of a leakage current of the dielectric layer structure 140A.

Figure 4:
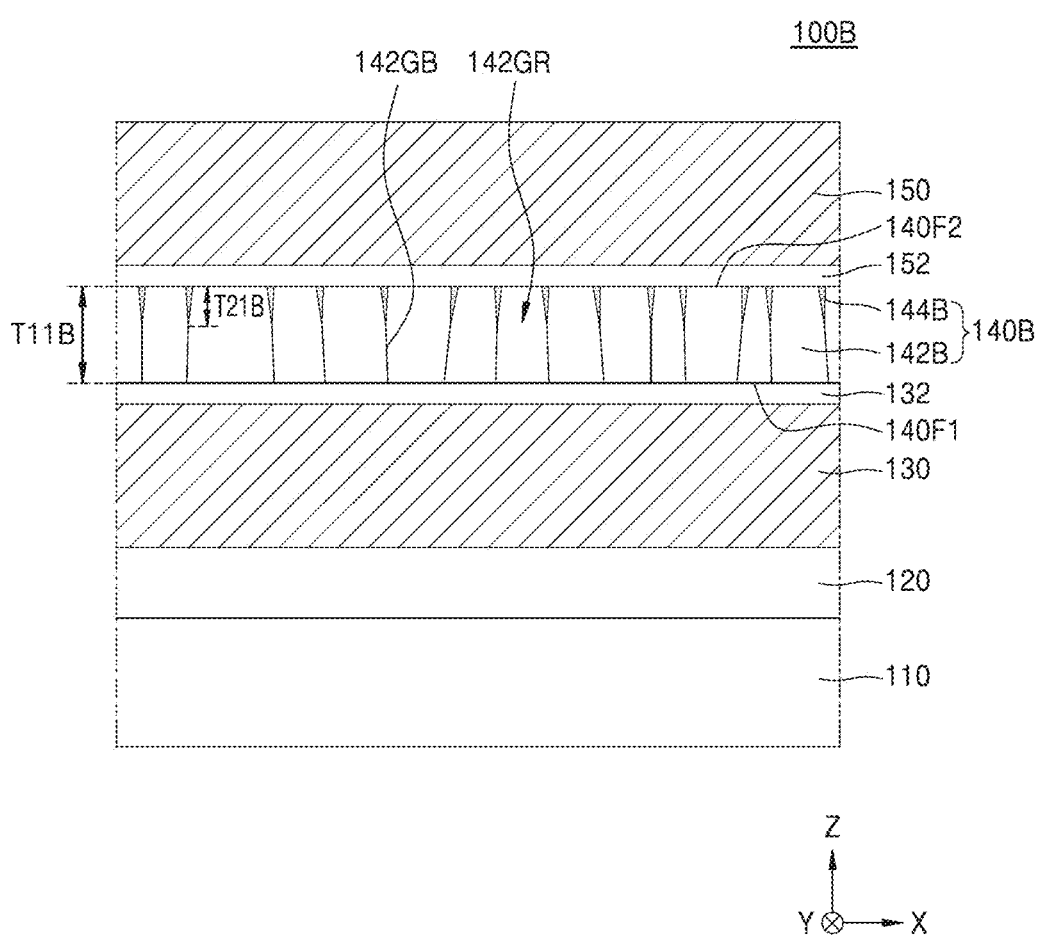
FIG. 4 is a cross-sectional view illustrating an integrated circuit device according to example embodiments.

FIG. 4 is a cross-sectional view illustrating an integrated circuit device 100B according to example embodiments. In FIGS. 1 to 4, like reference numerals refer to like elements.

Referring to FIG. 4, a dielectric layer structure 140B may include a first dielectric layer 142B and a second dielectric layer 144B. The first dielectric layer 142B may include a plurality of grains 142GR which extend from a first surface 140F1 to a second surface 140F2 of the dielectric layer structure 140B and extend over a first thickness T11B of the dielectric layer structure 140B. The second dielectric layer 144B may surround an upper portion of each of the grains 142GR of the first dielectric layer 142B. For example, as illustrated in FIG. 4, the second dielectric layer 144B may have a second thickness T21B from the second surface 140F2 to surround the plurality of grains 142GR and may contact a second interface layer 152.

In example embodiments, after the first dielectric layer 142B is formed, a preliminary second dielectric layer 144PB (see FIG. 16B) may be formed on the first dielectric layer 142B, and an annealing process may be performed on the preliminary second dielectric layer 144PB. The preliminary second dielectric layer 144PB may be easily diffused along the grain boundary 142GB of the first dielectric layer 142B and repositioned due to the annealing process, and thus, the second dielectric layer 144B may be disposed to surround a lower portion of the grain boundary 142GB of the first dielectric layer 142B.

The second dielectric layer 144B may be formed to have a certain thickness T21B from the second surface 140F2 of the dielectric layer structure 140B and to surround a sidewall of each of the grains 142GR of the first dielectric layer 142B, and thus, content of the second dielectric layer 144B included in the dielectric layer structure 140B may be relatively reduced. Accordingly, the second dielectric layer 144B may have an equivalent oxide thickness which is relatively small and effectively blocks a path of a leakage current of the dielectric layer structure 140B.

Figure 5:
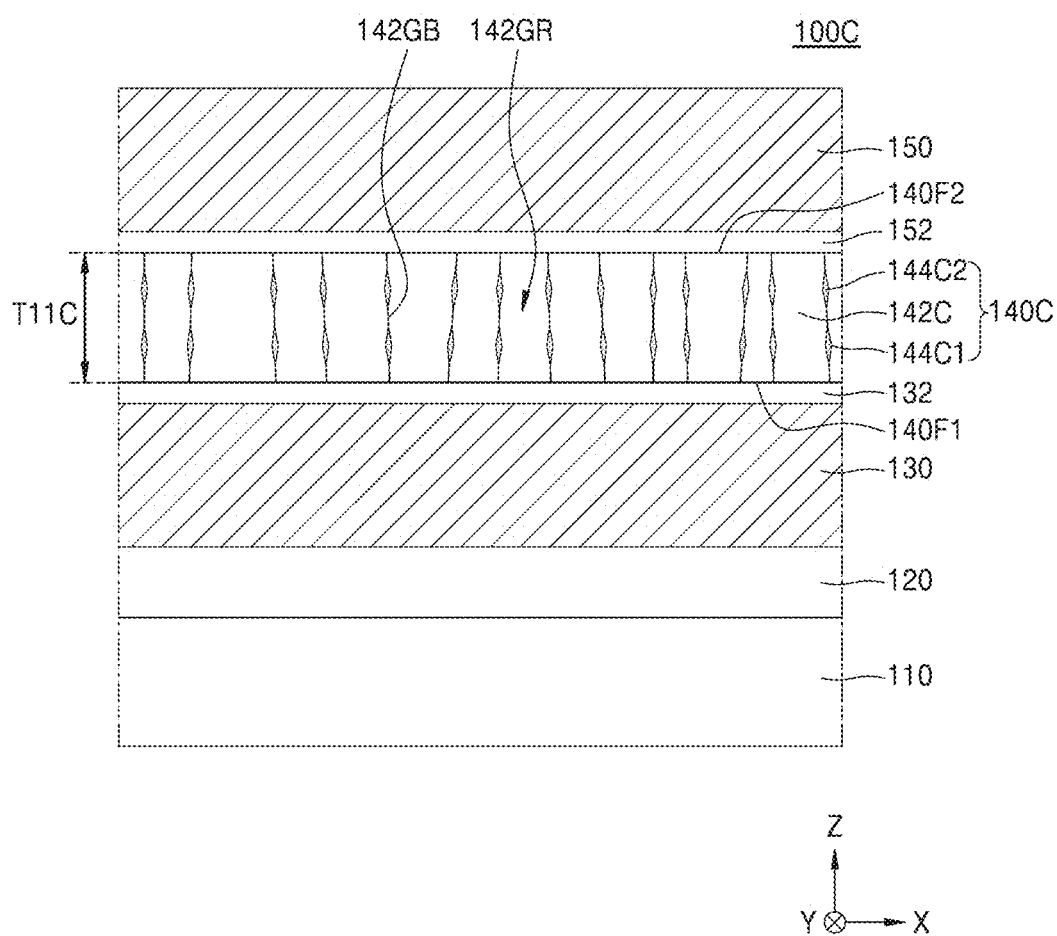
FIG. 5 is a cross-sectional view illustrating an integrated circuit device according to example embodiments.

FIG. 5 is a cross-sectional view illustrating an integrated circuit device 100C according to example embodiments. In FIGS. 1 to 5, like reference numerals refer to like elements.

Referring to FIG. 5, a dielectric layer structure 140C may include a first dielectric layer 142C, a lower second dielectric layer 144C1, and an upper second dielectric layer 144C2. The first dielectric layer 142C may include a plurality of grains 142GR which extend from a first surface 140F1 to a second surface 140F2 of the dielectric layer structure 140C and extend over a total first thickness T11C of the dielectric layer structure 140C. The lower second dielectric layer 144C1 may surround a lower sidewall of each of the grains 142GR of the first dielectric layer 142C, and the upper second dielectric layer 144C2 may surround an upper sidewall of each of the grains 142GR of the first dielectric layer 142C.

In example embodiments, the upper second dielectric layer 144C2 may be apart from the lower second dielectric layer 144C1 and may be disposed in a vertical direction (a Z direction). In other embodiments, at least a portion of the upper second dielectric layer 144C2 may be connected to the lower second dielectric layer 144C1. As illustrated in FIG. 5, the lower second dielectric layer 144C1 may not extend to the first surface 140F1 of the dielectric layer structure 140C, and the upper second dielectric layer 144C2 may not extend to the second surface 140F2 of the dielectric layer structure 140C. On the other hand, the lower second dielectric layer 144C1 may extend to the first surface 140F1 of the dielectric layer structure 140C, or the upper second dielectric layer 144C2 may extend to the second surface 140F2 of the dielectric layer structure 140C.

In example embodiments, the first dielectric layer 142C may be formed by sequentially forming a lower first dielectric layer 142L (see FIG. 18A), a middle first dielectric layer 142M (see FIG. 18B), and an upper first dielectric layer 142U (see FIG. 12C). For example, a grain 142GRM of the middle first dielectric layer 142M may grow from a grain 142GRL of the lower first dielectric layer 142L (see FIG. 18B), and by using the lower first dielectric layer 142L as a crystallization seed layer, the grain 142GRM of the middle first dielectric layer 142M may be formed to have the same crystallinity as that of the grain 142GRL of the lower first dielectric layer 142L. Also, by using the middle first dielectric layer 142M as a crystallization seed layer, the grain 142GRU of the upper first dielectric layer 142U (see FIG. 12C) may be formed to have the same crystalline phase as that of the grain 142GRM of the middle first dielectric layer 142M. For example, when the lower first dielectric layer 142L includes zirconium oxide having a tetragonal crystalline phase, the middle first dielectric layer 142M and the upper first dielectric layer 142U may be formed to have a tetragonal crystalline phase.

In example embodiments, a preliminary lower second dielectric layer 144PC1 (see FIG. 18A) may be formed after the lower first dielectric layer 142L is formed and before the middle first dielectric layer 142M is formed, and the preliminary lower second dielectric layer 144PC1 may be relatively easily diffused and repositioned through the grain boundary 142GB in a process of forming the middle first dielectric layer 142M. The preliminary lower second dielectric layer 144PC1 may be diffused and repositioned to surround the grain 142GRL of the lower first dielectric layer 142L and the grain 142GRM of the middle first dielectric layer 142M, thereby forming the lower second dielectric layer 144C1.

Moreover, a preliminary upper second dielectric layer 144PC2 (see FIG. 18B) may be formed after the middle first dielectric layer 142M is formed and before the upper first dielectric layer 142U is formed, and the preliminary upper second dielectric layer 144PC2 may be relatively easily diffused and repositioned through the grain boundary 142GB in a process of forming the upper first dielectric layer 142U. The preliminary upper second dielectric layer 144PC2 may be diffused and repositioned to surround the grain 142GRM of the middle first dielectric layer 142M and the grain 142GRU of the upper first dielectric layer 142U, thereby forming the upper second dielectric layer 144C2. Also, the grain 142GR of the first dielectric layer 142C having one crystalline direction may be formed by connecting the grain 142GRL of the lower first dielectric layer 142L, the grain 142GRM of the middle first dielectric layer 142M, and the grain 142GRU of the upper first dielectric layer 142U.

The lower second dielectric layer 144C1 and the upper second dielectric layer 144C2 may be formed to surround a sidewall of a grain 142GR of the first dielectric layer 142C. Accordingly, the lower second dielectric layer 144C1 and the upper second dielectric layer 144C2 may effectively block a path of a leakage current of the dielectric layer structure 140C, and the dielectric layer structure 140C may have an equivalent oxide thickness which is relatively small.

Figure 6:
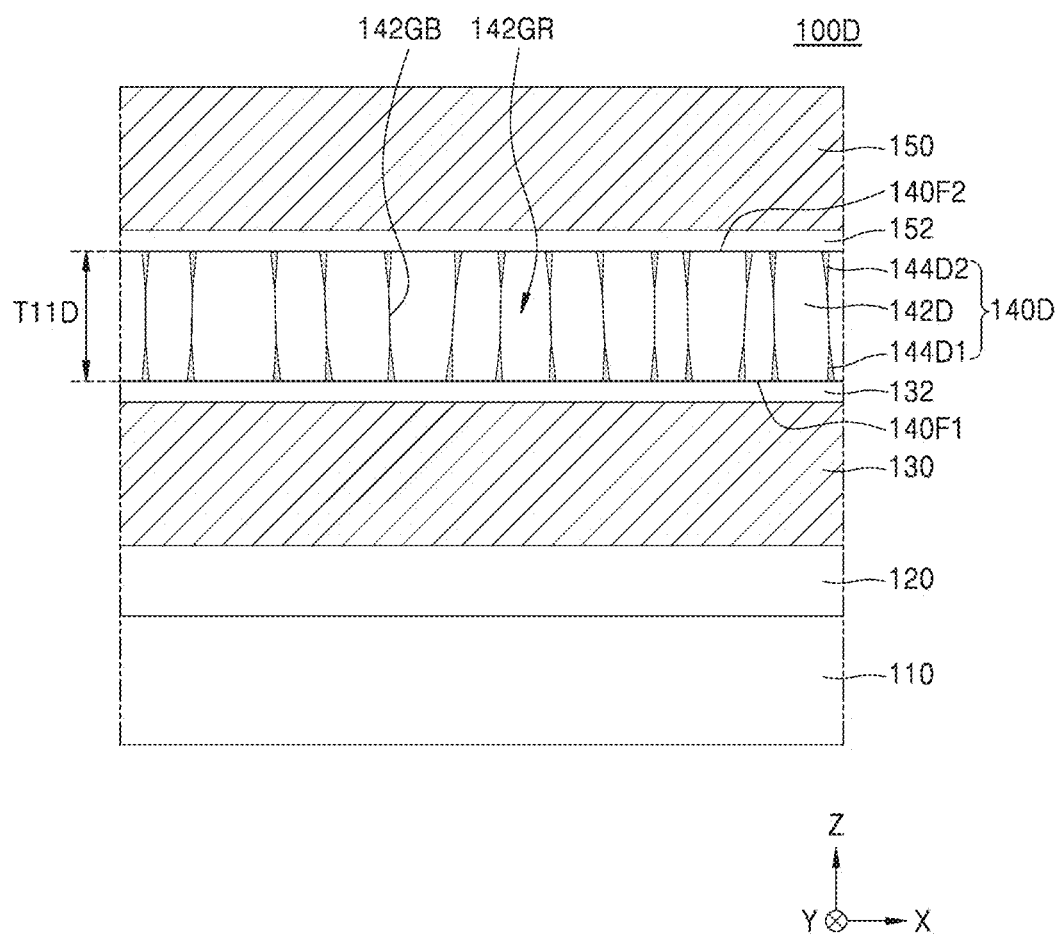
FIG. 6 is a cross-sectional view illustrating an integrated circuit device according to example embodiments.

FIG. 6 is a cross-sectional view illustrating an integrated circuit device 100D according to example embodiments. In FIGS. 1 to 6, like reference numerals refer to like elements.

Referring to FIG. 6, a dielectric layer structure 140D may include a first dielectric layer 142D, a lower second dielectric layer 144D1, and an upper second dielectric layer 144D2. The first dielectric layer 142D may include a plurality of grains 142GR which extend from a first surface 140F1 to a second surface 140F2 of the dielectric layer structure 140D and extend over a total first thickness T11D of the dielectric layer structure 140D. The lower second dielectric layer 144D1 may surround a lower sidewall of the grain 142GR of the first dielectric layer 142D from the first surface 140F1 of the dielectric layer structure 140D, and the upper second dielectric layer 144D2 may surround an upper sidewall of the grain 142GR of the first dielectric layer 142D from the upper second dielectric layer 144D2.

In example embodiments, the upper second dielectric layer 144D2 may be spaced apart from the lower second dielectric layer 144D1 and may be disposed in a vertical direction (a Z direction). In other embodiments, at least a portion of the upper second dielectric layer 144D2 may be connected to the lower second dielectric layer 144D1.

In example embodiments, a preliminary second dielectric layer 144PA (see FIG. 14A) may be formed on a lower electrode 130, a first dielectric layer 142D may be formed on the preliminary second dielectric layer 144PA, a preliminary second dielectric layer 144PB (see FIG. 16B) may be formed on the first dielectric layer 142D, and an annealing process may be performed on a structure where the preliminary second dielectric layer 144PB is formed. The preliminary second dielectric layers 144PA and 144PB may be easily diffused and repositioned along a grain boundary 142GB of the first dielectric layer 142D, and thus, the lower second dielectric layer 144D1 and the upper second dielectric layer 144D2 may be disposed to respectively surround a lower portion and an upper portion of the grain boundary 142GB of the first dielectric layer 142D.

Figure 7:
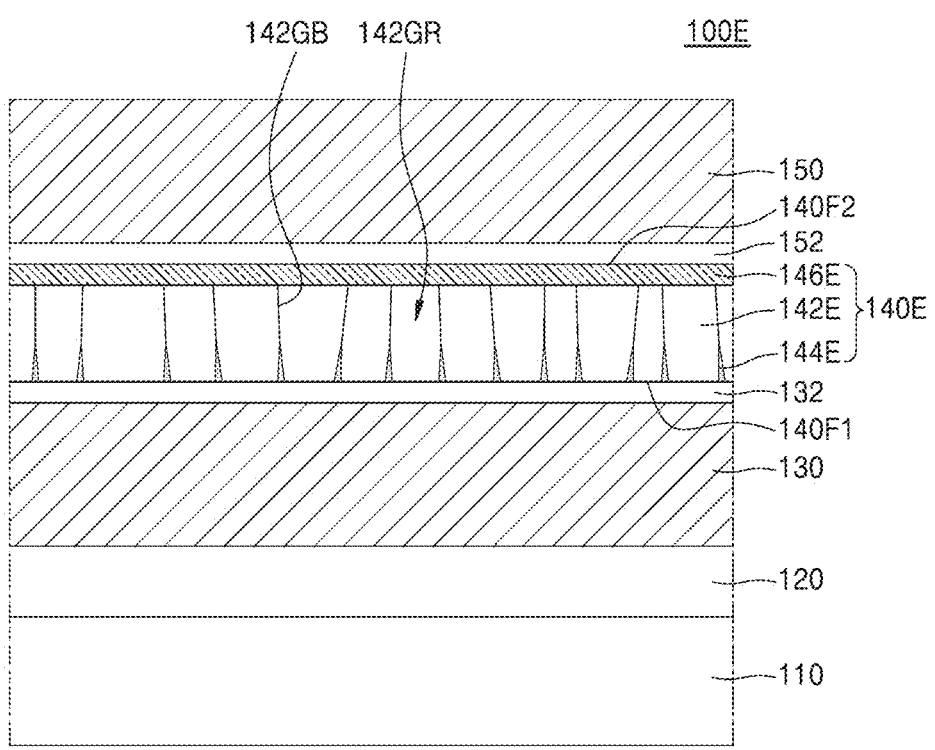
FIG. 7 is a cross-sectional view illustrating an integrated circuit device according to example embodiments.

FIG. 7 is a cross-sectional view illustrating an integrated circuit device 100E according to example embodiments. In FIGS. 1 to 7, like reference numerals refer to like elements.

Referring to FIG. 7, a dielectric layer structure 140E may include a first dielectric layer 142E, a second dielectric layer 144E, and a third dielectric layer 146E. The first dielectric layer 142E may include a plurality of grains 142GR, the second dielectric layer 144E may be disposed to surround a lower sidewall of each of the plurality of grains 142GR, and the third dielectric layer 146E may be disposed on a whole surface of the first dielectric layer 142E.

The third dielectric layer 146E may include a third dielectric material, and the third dielectric material may include a metal oxide having bandgap energy, which is higher than that of the first dielectric material included in the first dielectric layer 142E. For example, the third dielectric material may include at least one of boron oxide ($B_2O_3$), aluminium oxide ($Al_2O_3$), gallium oxide ($Ga_2O_3$), indium oxide ($In_2O_3$), and beryllium oxide (BeO). The third dielectric material may include the same material as the second dielectric material included in the second dielectric layer 144E, or may include a material which differs from the second dielectric material of the second dielectric layer 144E.

The third dielectric layer 146E may be disposed on the first dielectric layer 142E and may decrease a surface roughness of the first dielectric layer 142E or decrease a leakage current flowing through the first dielectric layer 142E. The present embodiment is not limited to the above description.

Figure 8:
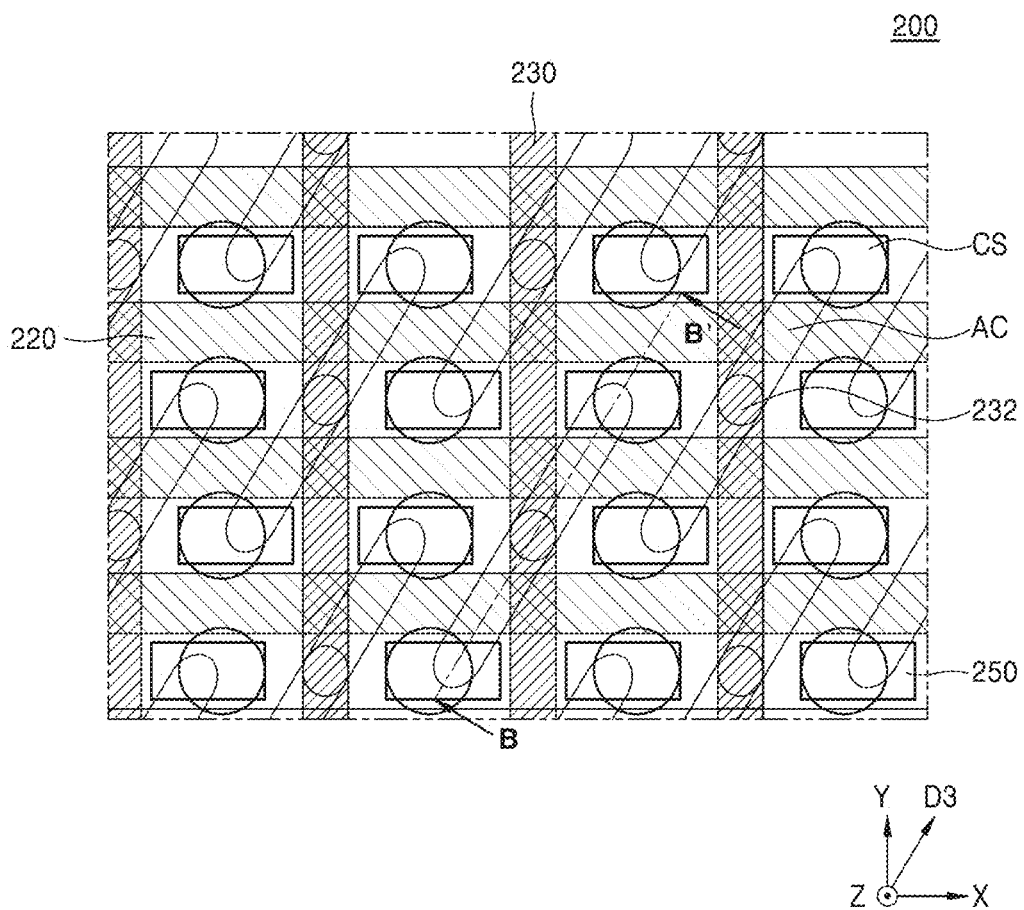
FIG. 8 is a layout view illustrating an integrated circuit device according to example embodiments.
Figure 9:
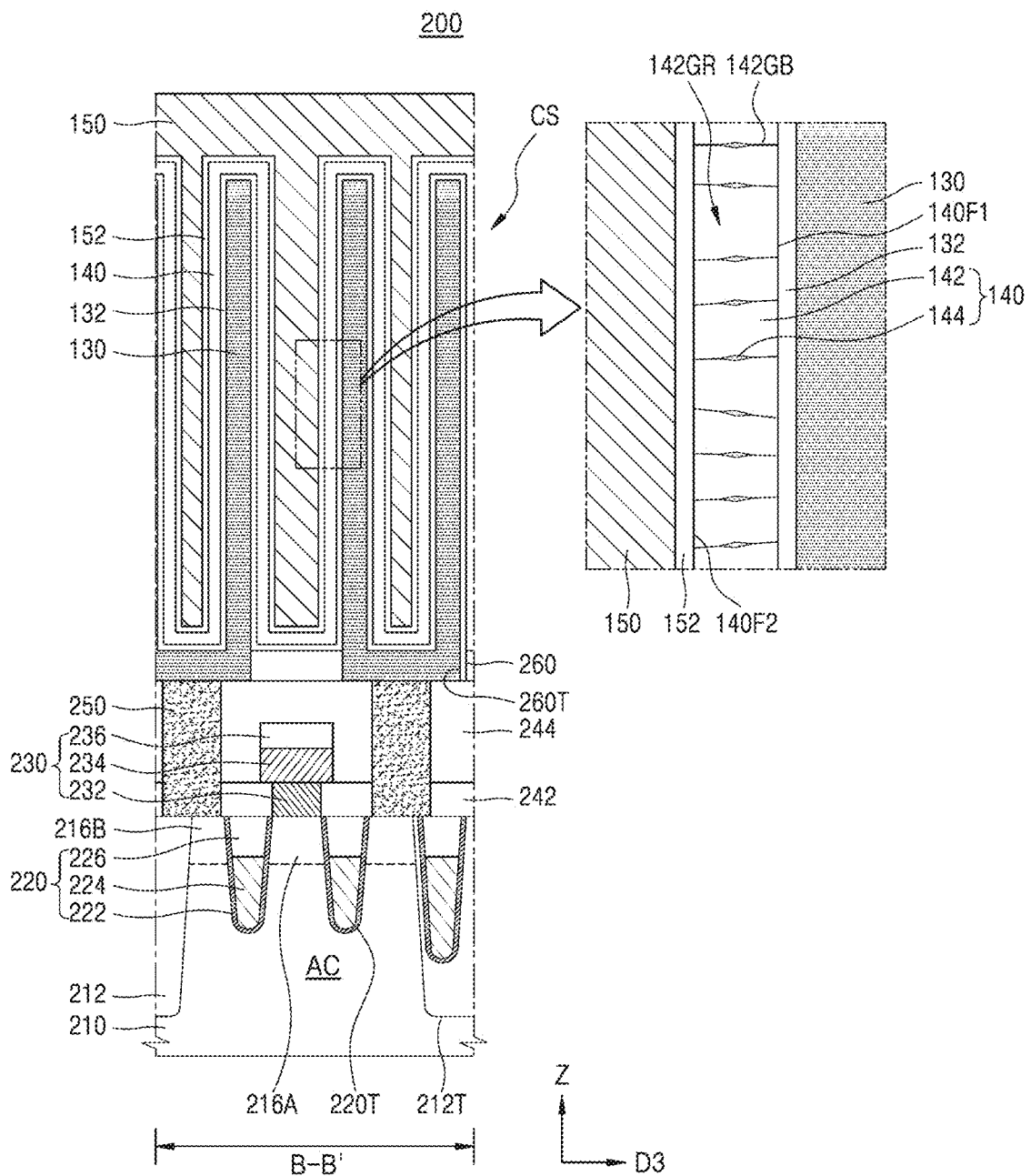
FIG. 9 is a cross-sectional view taken along line B-B' of FIG. 8.

FIG. 8 is a layout view illustrating an integrated circuit device 200 according to example embodiments. FIG. 9 is a cross-sectional view taken along line B-B' of FIG. 8. In FIGS. 1 to 9, like reference numerals refer to like elements.

Referring to FIGS. 8 and 9, a substrate 210 may include an active region AC defined by an isolation layer 212. In example embodiments, the substrate 210 may include a semiconductor material such as Si, Ge, SiGe, SiC, GaAs, InAs, or InP. In example embodiments, the substrate 210 may include a conductive region (for example, an impurity-doped well or an impurity-doped structure).

The isolation layer 212 may have a shallow trench isolation (STI) structure. For example, the isolation layer 212 may include an insulating material which fills an isolation trench 212T formed in the substrate 210. The insulating material may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), but is not limited thereto.

The active region AC may have a relatively long island shape having a short axis and a long axis. As illustrated in FIG. 8, the long axis of the active region AC may be arranged in a D3 direction parallel to an upper surface of the substrate 210. In example embodiments the active region AC may be doped with P-type or N-type impurities.

The substrate 210 may further include a gate line trench 220T which extends in an X direction parallel to the upper surface of the substrate 210. The gate line trench 220T may intersect with the active region AC and may be formed to have a certain depth from the upper surface of the substrate 210. A portion of the gate line trench 220T may extend to the inside of the isolation layer 212, and a portion of the gate line trench 220T formed in the isolation layer 212 may include a bottom surface disposed in a level which is lower than that of a portion of the gate line trench 220T formed in the active region AC.

A first source/drain region 216A and a second source/drain region 216B may be disposed in an upper portion of the active region AC disposed in both sides of the gate line trench 220T. The first source/drain region 216A and the second source/drain region 216B may be an impurity region doped with impurities having a conductivity type which differs from those of impurities doped in the active region AC. The first source/drain region 216A and the second source/drain region 216B may be doped with P-type or N-type impurities.

A gate structure 220 may be formed in the gate line trench 220T. The gate structure 220 may include a gate insulation layer 222, a gate electrode 224, and a gate capping layer 226, which are sequentially formed on an inner wall of the gate line trench 220T.

The gate insulation layer 222 may be conformally formed on an inner wall of the gate line trench 220T to have a certain thickness. The gate insulation layer 222 may include at least one material selected from among silicon oxide, silicon nitride, silicon oxynitride, oxide/nitride/oxide (ONO), and a high-k material having a dielectric constant which is higher than that of silicon oxide. For example, the gate insulation layer 222 may have a dielectric constant of about 10 to about 25. In some embodiments, the gate insulation layer 222 may include $HfO_2$, $ZrO_2$, $Al_2O_3$, $HfAlO_3$, $Ta_2O_3$, $TiO_2$, or a combination thereof, but is not limited thereto.

The gate electrode 224 may be formed to fill the gate line trench 220T up to a certain height from a bottom of the gate line trench 220T on the gate insulation layer 222. The gate electrode 224 may include a work function control layer (not shown) disposed on the gate insulation layer 222 and a buried metal layer (not shown) filling the bottom of the gate line trench 220T on the word function control layer. For example, the work function control layer may include a metal, a metal nitride, or a metal carbide, such as Ti, TiN, TiAlN, TiAlC, TiAlCN, TiSiCN, Ta, TaN, TaAlN, TaAlCN, or TaSiCN, and the buried metal layer may include at least one of W, WN, TiN, and TaN.

The gate capping layer 226 may fill a remaining portion of the gate line trench 220T on the gate electrode 224. For example, the gate capping layer 226 may include at least one of silicon oxide, silicon oxynitride, and silicon nitride.

A bit line structure 230, which is parallel to the upper surface of the substrate 210 and extends in a Y direction vertical to the X direction, may be formed on the first source/drain region 216A. The bit line structure 230 may include a bit line contact 232, a bit line 234, and a bit line capping layer 236, which are sequentially stacked on the substrate 210. For example, the bit line contact 232 may include polysilicon, and the bit line 234 may include a metal material. The bit line capping layer 236 may include an insulating material such as silicon oxide or silicon oxynitride. In FIG. 9, it is illustrated that the bit line contact 232 is formed to have a bottom surface having the same level as that of the upper surface of the substrate 210, but the present embodiment is not limited thereto. In other embodiments, a recess (not shown) may be formed to have a certain depth from the upper surface of the substrate 210, and the bit line contact 232 may extend to the inside of the recess, whereby a bottom surface of the bit line contact 232 may be formed in a level which is lower than that of the upper surface of the substrate 210.

Optionally, a bit line middle layer (not shown) may be disposed between the bit line contact 232 and the bit line 234. The bit line middle layer may include metal silicide such as tungsten silicide or metal nitride such as tungsten nitride. A bit line spacer (not shown) may be further formed on a sidewall of the bit line structure 230. The bit line spacer may have a multilayer structure or a single layer structure, which includes an insulating material such as silicon oxide, silicon oxynitride, or silicon nitride. Also, the bit line spacer may further include an air spacer (not shown).

A first interlayer insulation layer 242 may be formed on the substrate 210, and the bit line contact 232 may pass through the first interlayer insulation layer 242 and may be connected to the first source/drain region 216A. The bit line 234 and the bit line capping layer 236 may be disposed on the first interlayer insulation layer 242. A second interlayer insulation layer 244 may be disposed to cover a side surface of the bit line 234 and a side surface and an upper surface of the bit line capping layer 236 on the first interlayer insulation layer 242.

The contact structure 250 may be disposed in the second source/drain region 216B. First and second interlayer insulation layers 242 and 244 may surround a sidewall of the contact structure 250. In example embodiments, the contact structure 250 may include a lower contact pattern (not shown), a metal silicide layer (not shown), and an upper contact pattern (not shown) sequentially stacked on the substrate 210 and a barrier layer (not shown) surrounding a side surface and a bottom surface of the upper contact pattern. In example embodiments, the lower contact pattern may include polysilicon, and the upper contact pattern may include a metal material. The barrier layer may include conductive metal nitride.

A capacitor structure CS may be disposed on the second interlayer insulation layer 244. The capacitor structure CS may include a lower electrode 130 electrically connected to the contact structure 250, a dielectric layer structure 140 conformally covering the lower electrode 130, and/or an upper electrode 150 on the dielectric layer structure 140. An etch stop layer 260 including an opening 260T may be formed on the second interlayer insulation layer 244, and a bottom of the lower electrode 130 may be disposed in the opening 260T of the etch stop layer 260.

In FIG. 8, it is illustrated that the capacitor structure CS is repeatedly arranged in the X direction and the Y direction on the contact structure 250 repeatedly arranged in the X direction and the Y direction. However, unlike the illustration of FIG. 8, the capacitor structure CS may be arranged in, for example, a hexagonal shape such as a honeycomb structure on the contact structure 250 repeatedly arranged in the X direction and the Y direction, and in this case, a landing pad (not shown) may be further formed between the contact structure 250 and the capacitor structure CS.

The lower electrode 130 may be formed on the contact structure 250 in a cylindrical shape or a cup shape having a closed bottom. Although not shown, a supporting part (not shown) may be further formed on a sidewall of the lower electrode 130 and may prevent the lower electrode 130 from being inclined or collapsing. Description given above with reference to FIGS. 1 and 2 may be applied to the lower electrode 130.

A dielectric layer structure 140 may be disposed on the lower electrode 130 and the etch stop layer 260. The dielectric layer structure 140 may include a first dielectric layer 142 and a second dielectric layer 144. The first dielectric layer 142 may include a plurality of grains 142GR which extend over a total thickness of the dielectric layer structure 140, and the second dielectric layer 144 may surround at least a portion of a sidewall of each of the plurality of grains 142GR. Description given above with reference to FIGS. 1 and 2 may be applied to the dielectric layer structure 140. Also, instead of the dielectric layer structure 140, one of the dielectric layer structures 140A to 140E described above with reference to FIGS. 3 to 7 may be disposed on the lower electrode 130.

The upper electrode 150 may be disposed on the dielectric layer structure 140. Description given above with reference to FIGS. 1 and 2 may be applied to the upper electrode 150.

According to the integrated circuit device 200 described above, the second dielectric layer 144 may effectively block a path of a leakage current of the dielectric layer structure 140, and the dielectric layer structure 140 may have an equivalent oxide thickness which is relatively small.

Figure 10:
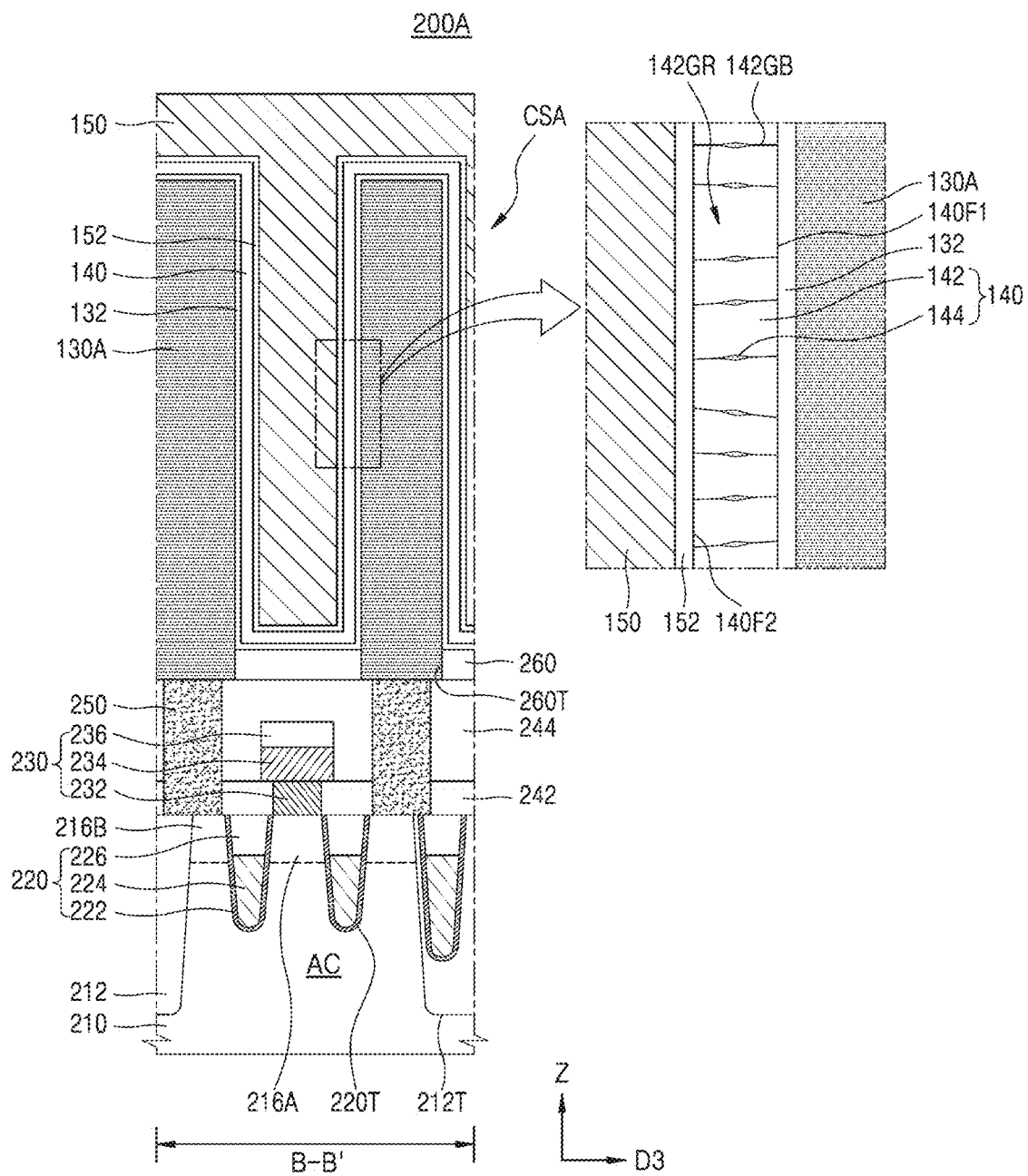
FIG. 10 is a cross-sectional view illustrating a semiconductor device according to example embodiments.

FIG. 10 is a cross-sectional view illustrating a semiconductor device 200A according to example embodiments. FIG. 10 is a cross-sectional view corresponding to a cross-sectional surface taken along line B-B' of FIG. 8. In FIGS. 1 to 10, like reference numerals refer to like elements.

Referring to FIG. 10, a capacitor structure CSA may include a lower electrode 130A of a pillar type. A bottom of the lower electrode 130A may be disposed in an opening 260T of an etch stop layer 260, and the lower electrode 130A may have a circular-pillar shape, a tetragonal-pillar shape, or a polygonal-pillar shape extending in a vertical direction (a Z direction). A dielectric layer structure 140 may be conformally disposed on the lower electrode 130A and the etch stop layer 260. Although not shown, a supporting part may be further formed on a sidewall of the lower electrode 130A and may prevent the lower electrode 130A from being inclined or collapsing.

Figure 11:
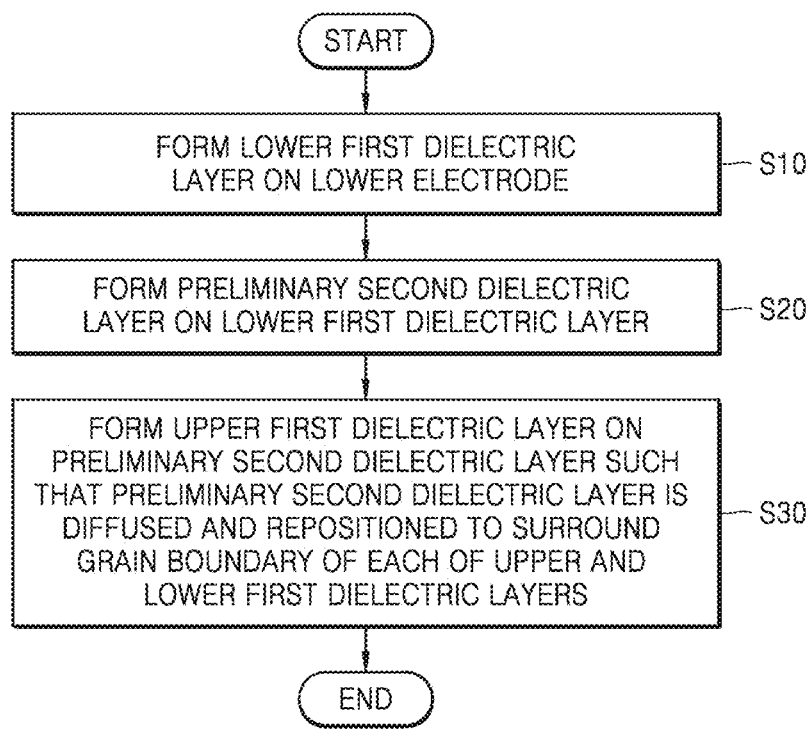
FIG. 11 is a flowchart illustrating a method of manufacturing an integrated circuit device, according to example embodiments.

FIG. 11 is a flowchart illustrating a method of manufacturing an integrated circuit device 100, according to example embodiments. FIGS. 12A to 12D are cross-sectional views illustrating a method of manufacturing the integrated circuit device 100 in a process sequence, according to example embodiments.

Referring to FIGS. 11 and 12A, a lower electrode 130 may be formed on a substrate 110, and a first dielectric layer 142L may be formed on the lower electrode 130 in operation S10.

Before forming the lower electrode 130, an interlayer insulation layer or another lower structure may be further formed on the substrate 110. The lower electrode 130 may be formed through a chemical vapor deposition (CVD) process, a metal organic CVD (MOCVD) process, an atomic layer deposition (ALD) process, or a metal organic ALD (MOALD) process.

Optionally, a first interface layer 132 may be further formed on the lower electrode 130. For example, the first interface layer 132 may be formed by performing an oxidization process on an exposed surface of the lower electrode 130.

A lower first dielectric layer 142L may be formed to have a first thickness T01 by using a first dielectric material through a CVD process, an MOCVD process, an ALD process, or an MOALD process. In the lower first dielectric layer 142L, a plurality of grains 142GRL may extend in a vertical direction (a Z direction) with respect to a grain boundary 142GB.

Referring to FIGS. 11 and 12B, a preliminary second dielectric layer 144P may be formed on the lower first dielectric layer 142L in operation S20.

The preliminary second dielectric layer 144P may be formed to have a second thickness T02 less than the first thickness T01 of the lower first dielectric layer 142L by using a second dielectric material. The second dielectric material may be a material having bandgap energy, which is higher than that of the first dielectric material, and the second dielectric material may be a material having a melting point which is lower than that of the first dielectric material. The second dielectric material may be formed predominantly on the grain boundary 142GB of the preliminary second dielectric layer 144P and may have a plurality of island shapes and/or a plurality of line shapes. However, unlike illustration, the preliminary second dielectric layer 144P may be formed to have a relatively thick thickness for covering a whole exposed surface of the lower first dielectric layer 142L.

Figure 12D:
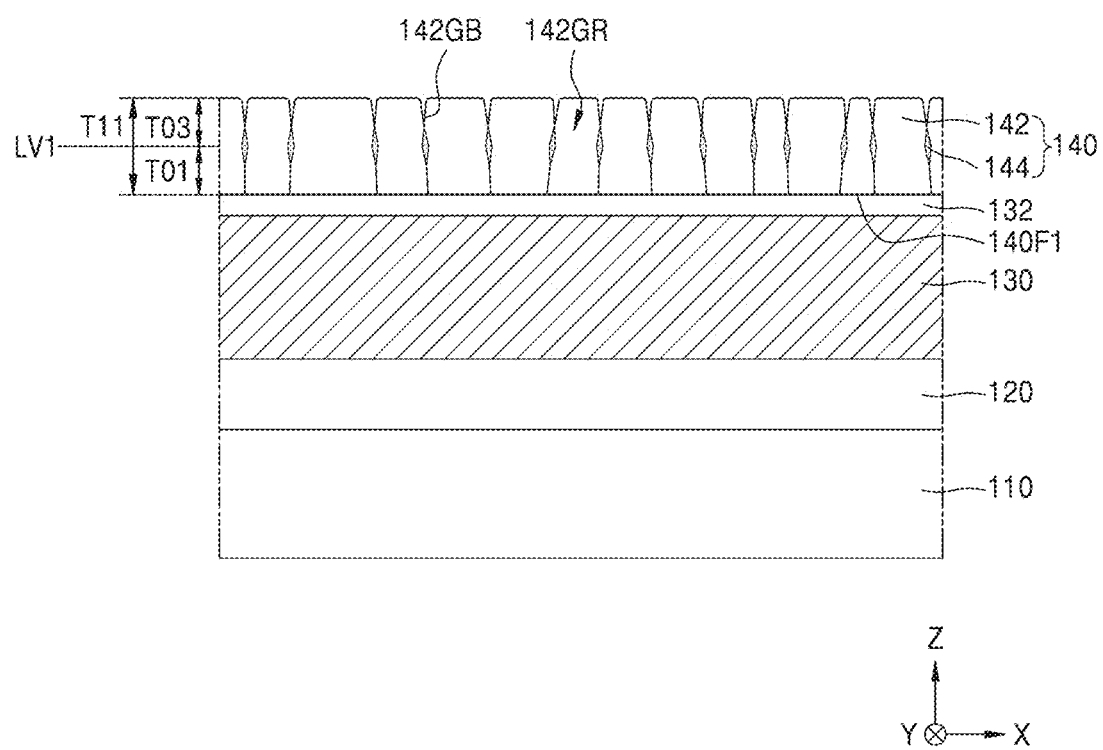

Referring to FIGS. 11, 12C, and 12D, an upper first dielectric layer 142U may be formed on the preliminary second dielectric layer 144P and the lower first dielectric layer 142L in operation S30. At this time, the preliminary second dielectric layer 144P may be diffused and repositioned, and thus, may be disposed to surround the grain boundary 142GB of the upper first dielectric layer 142U and the lower first dielectric layer 142L.

The upper first dielectric layer 142U may be formed to have a third thickness T03 by using the first dielectric material through a CVD process, an MOCVD process, an ALD process, or an MOALD process. In the upper first dielectric layer 142U, a plurality of grains 142GRU may extend in the vertical direction (the Z direction) with respect to the grain boundary 142GB.

The upper first dielectric layer 142U may be formed on the lower first dielectric layer 142L by using the lower first dielectric layer 142L as a crystallization seed layer, and a grain 142GRL of the lower first dielectric layer 142L and a grain 142GRU of the upper first dielectric layer 142U may be formed to have the same crystalline direction. In FIG. 12C, for convenience of understanding, an interface 142GI between the grain 142GRL of the lower first dielectric layer 142L and the grain 142GRU of the upper first dielectric layer 142U is illustrated, but the grain 142GRL of the lower first dielectric layer 142L and the grain 142GRU of the upper first dielectric layer 142U may be connected to each other and provided as one grain 142GR, whereby the interface 142GI may not be identified.

The upper first dielectric layer 142U may be formed on the lower first dielectric layer 142L by using the lower first dielectric layer 142L as a crystallization seed layer, and thus, the upper first dielectric layer 142U may have good crystallinity even when a third thickness T03 of the upper first dielectric layer 142U is relatively thin. For example, when the lower first dielectric layer 142L includes zirconium oxide having a tetragonal crystalline phase, the upper first dielectric layer 142U may include zirconium oxide having a tetragonal crystalline phase.

In a process of forming the upper first dielectric layer 142U, the preliminary second dielectric layer 144P may be relatively easily diffused and repositioned through the grain boundary 142GB. The second dielectric material included in the preliminary second dielectric layer 144P may be a material having a melting point which is lower than that of the first dielectric material, and thus, may be relatively easily diffused or moved through the grain boundary 142GB in a process of forming the upper first dielectric layer 142U. For example, when the second dielectric material include boron oxide ($B_2O_3$), $B_2O_3$ may have a melting point of about 450° C. which is relatively low, and for example, may be easily diffused and repositioned in a process of forming the upper first dielectric layer 142U at a process temperature of about 100° C. to about 400° C. Therefore, the preliminary second dielectric layer 144P may be disposed to surround a portion of a sidewall of the grain 142GRL of the lower first dielectric layer 142L and a portion of a sidewall of the grain 142GRU of the upper first dielectric layer 142U.

The first dielectric layer 142 may be formed by connecting the upper first dielectric layer 142U to the lower first dielectric layer 142L, and the preliminary second dielectric layer 144P may be disposed to surround the grain 142GR of the first dielectric layer 142, thereby forming the second dielectric layer 144.

In example embodiments, a process temperature for forming the upper first dielectric layer 142U may be higher than a process temperature for forming the lower first dielectric layer 142L. For example, a process temperature for forming the upper first dielectric layer 142U may be about 100° C. to about 400° C. In other embodiments, a process temperature for forming the upper first dielectric layer 142U may be substantially the same as a process temperature for forming the lower first dielectric layer 142L, and after the upper first dielectric layer 142U is formed, an optional annealing process may be further performed.

Subsequently, an upper electrode 150 (see FIG. 1) may be formed on the dielectric layer structure 140.

The integrated circuit device 100 may be finished based on the above-described manufacturing method.

Generally, zirconium oxide having a crystalline phase may be relatively high in leakage current flowing through a grain boundary, and a structure of the dielectric layer structure CO-40 according to the comparative example described above with reference to FIG. 19B may be applied for decreasing the leakage current. However, the first dielectric layer DLC1 having a relatively thick thickness may have good crystallinity, but the third dielectric layer DLC3 having a relatively small thickness may be low in crystallinity or may have an amorphous structure. Amorphous zirconium oxide may have a dielectric constant which is lower than that of crystalline zirconium oxide, and thus, there is a limitation in decreasing an equivalent oxide thickness of the dielectric layer structure CO-40.

On the contrary, according to the above-described integrated circuit device 100, the second dielectric material included in the second dielectric layer 144 may have bandgap energy, which is higher than that of the first dielectric material included in the first dielectric layer 142, and/or may include a metal oxide having a melting point which is lower than that of the first dielectric material. Therefore, in a process of forming the first dielectric layer 142, the second dielectric layer 144 may be relatively easily diffused and repositioned along the grain boundary 142GB of the first dielectric layer 142, and thus, the second dielectric layer 144 may be disposed to surround at least a portion of a sidewall of the grain 142GR of the first dielectric layer 142. Therefore, the first dielectric layer 142 may have good crystallinity with respect to a total thickness thereof, and the second dielectric layer 144 may effectively block a path of a leakage current flowing through the grain boundary 142GB of the first dielectric layer 142. Accordingly, the dielectric layer structure 140 may have a reduced leakage current and may have an equivalent oxide thickness which is relatively small.

Figure 13:
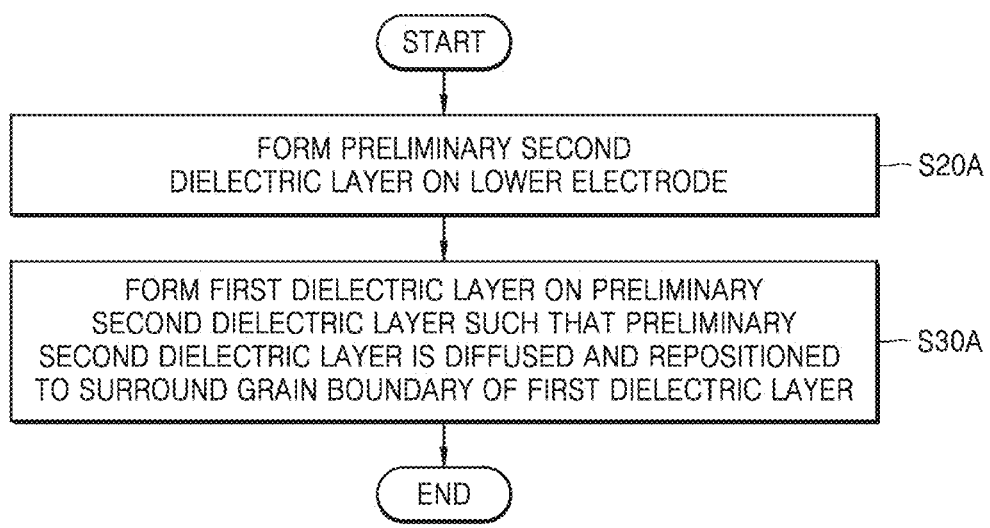
FIG. 13 is a flowchart illustrating a method of manufacturing an integrated circuit device, according to example embodiments.
Figure 14A:
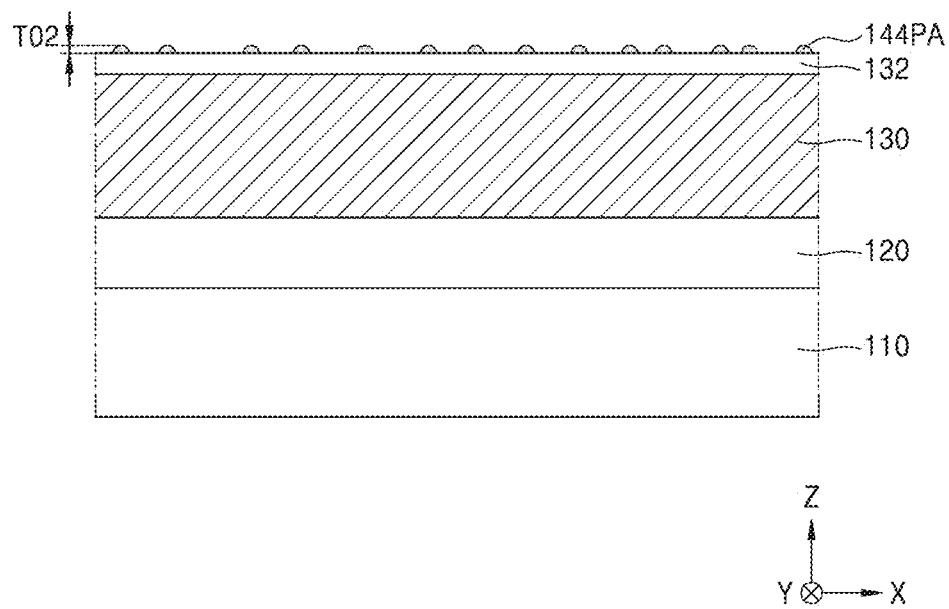
FIGS. 14A and 14B are cross-sectional views illustrating a method of manufacturing an integrated circuit device in a process sequence, according to example embodiments.
Figure 14B:
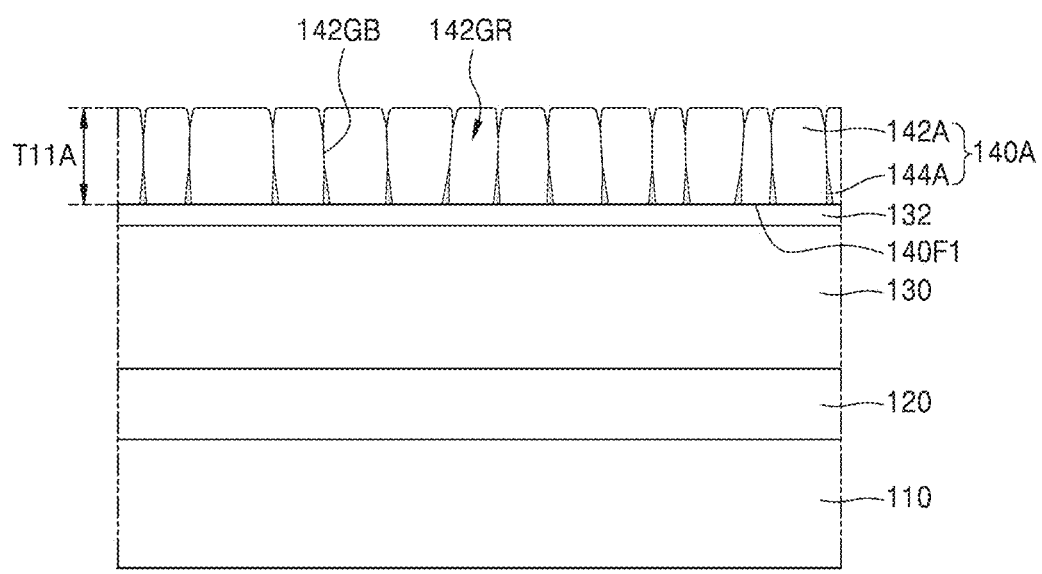

FIG. 13 is a flowchart illustrating a method of manufacturing an integrated circuit device 100A, according to example embodiments. FIGS. 14A and 14B are cross-sectional views illustrating a method of manufacturing the integrated circuit device 100A in a process sequence, according to example embodiments.

Referring to FIGS. 13 and 14A, a preliminary second dielectric layer 144PA may be formed on a lower electrode 130 in operation S20A.

As illustrated in FIG. 14A, the preliminary second dielectric layer 144PA may have a plurality of island shapes and/or a plurality of line shapes and may be formed to have a second thickness T02. However, unlike illustration, the preliminary second dielectric layer 144PA may include a continuous material layer which covers a whole exposed surface of the lower electrode 130 (or the first interface layer 132).

Referring to FIGS. 13 and 14B, a first dielectric layer 142A may be formed on the preliminary second dielectric layer 144PA and the lower electrode 130 in operation S30A. At this time, the preliminary second dielectric layer 144PA may be diffused and repositioned and may be disposed to surround a grain boundary 142GB of the first dielectric layer 142A.

The first dielectric layer 142A may be formed to have a first thickness T11A by using the first dielectric material through a CVD process, an MOCVD process, an ALD process, or an MOALD process. In the first dielectric layer 142A, a plurality of grains 142GR may extend in a vertical direction (a Z direction) with respect to the grain boundary 142GB. The first dielectric layer 142A may be formed to have the first thickness T11A which is relatively thick and may have good crystallinity. For example, the first dielectric layer 142A may include zirconium oxide having a tetragonal crystalline phase over the first thickness T11A.

In a process of forming the first dielectric layer 142A, the preliminary second dielectric layer 144PA may be relatively easily diffused and repositioned through the grain boundary 142GB. The preliminary second dielectric layer 144PA may be disposed to surround a lower portion of a sidewall of the first dielectric layer 142A. The preliminary second dielectric layer 144PA may be disposed to surround the grain 142GR of the first dielectric layer 142A, and thus, the second dielectric layer 144A may be formed.

Optionally, after the first dielectric layer 142A is formed, an annealing process may be further performed.

Figure 15:
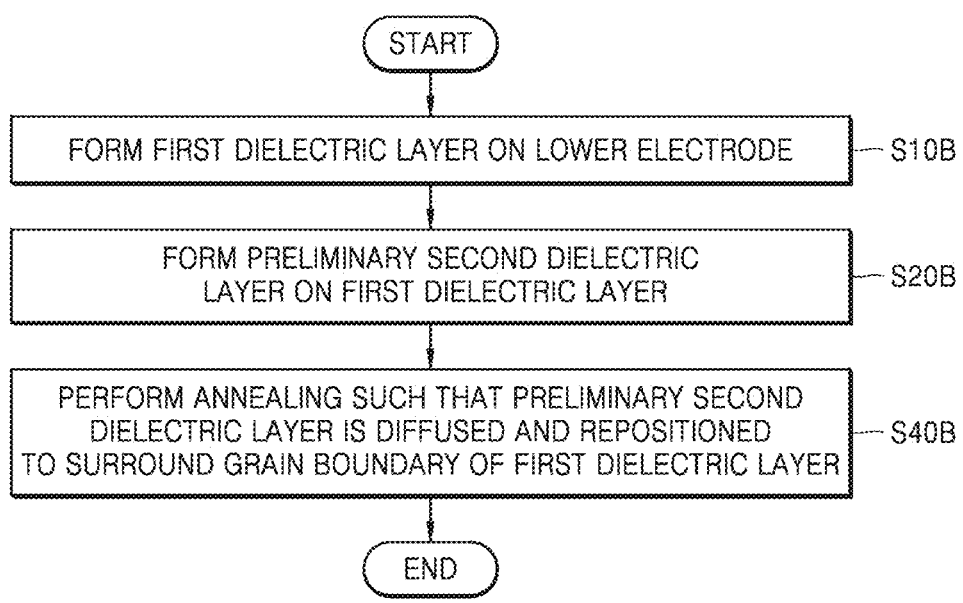
FIG. 15 is a flowchart illustrating a method of manufacturing an integrated circuit device, according to example embodiments.
Figure 16A:
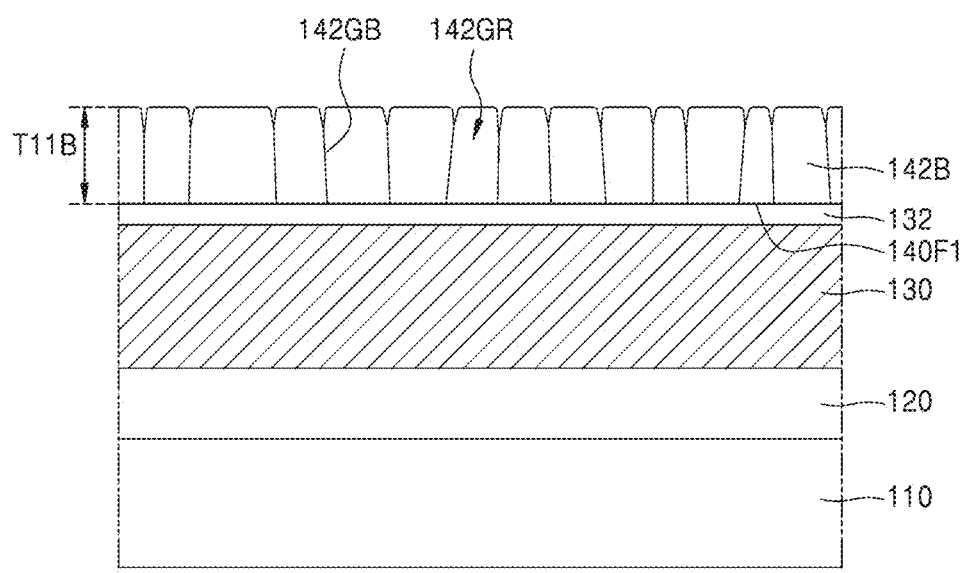
FIGS. 16A to 16C are cross-sectional views illustrating a method of manufacturing an integrated circuit device in a process sequence, according to example embodiments.
Figure 16B:
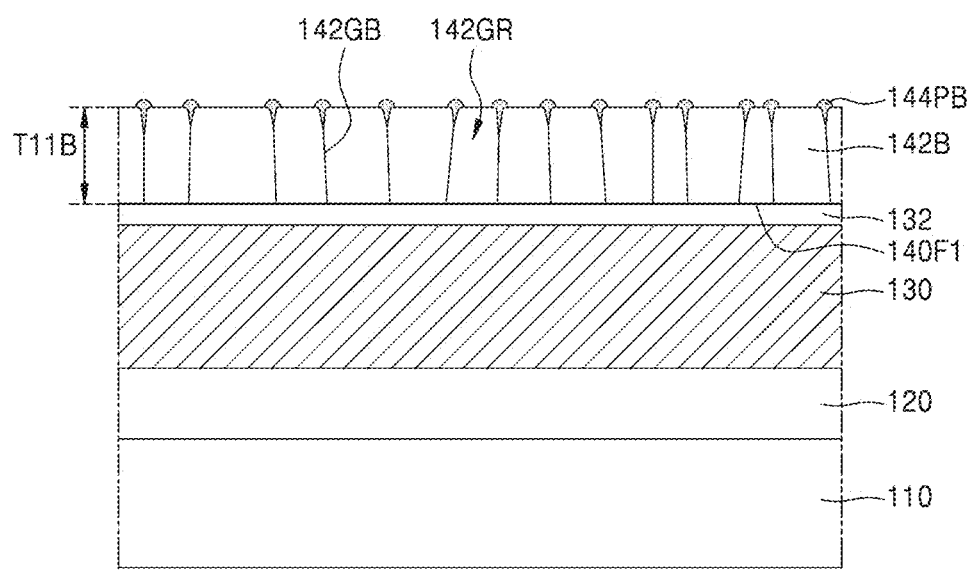
Figure 16C:
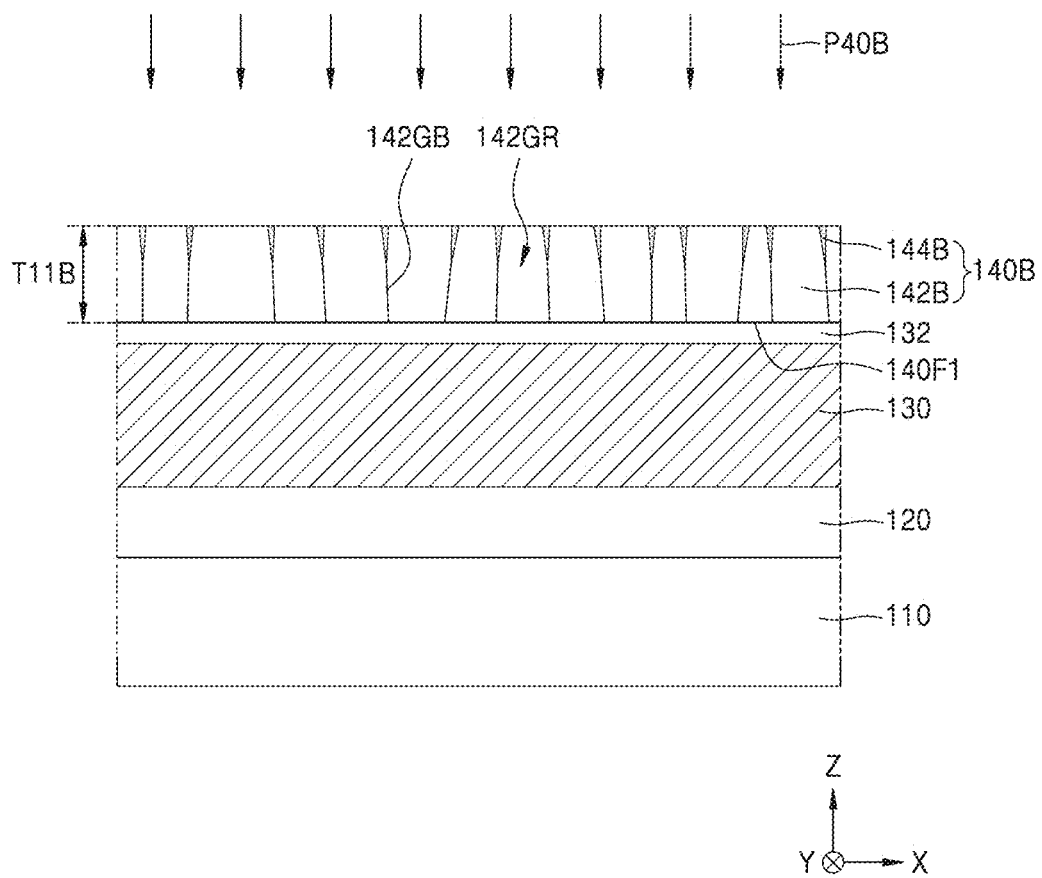

FIG. 15 is a flowchart illustrating a method of manufacturing an integrated circuit device 100B, according to example embodiments. FIGS. 16A to 16C are cross-sectional views illustrating a method of manufacturing the integrated circuit device 100B in a process sequence, according to example embodiments.

Referring to FIGS. 15 and 16A, a first dielectric layer 142B may be formed on a lower electrode 130 in operation S10B.

The first dielectric layer 142B may be formed on the lower electrode 130 to have a first thickness T11B. In the first dielectric layer 142B, a plurality of grains 142GR may extend in a vertical direction (a Z direction) with respect to a grain boundary 142GB. The first dielectric layer 142B may be formed to have a first thickness T11B which is relatively thick and may have good crystallinity. For example, the first dielectric layer 142B may include zirconium oxide having a tetragonal crystalline phase over the first thickness T11B.

Referring to FIGS. 15 and 16A, a preliminary second dielectric layer 144PB may be formed on the first dielectric layer 142B in operation S20B. The preliminary second dielectric layer 144PB may be formed predominantly on a grain boundary 142GB and may have a plurality of island shapes and/or a plurality of line shapes.

Referring to FIGS. 15 and 16C, in operation S40B, an annealing process P40B may be performed on a structure where the preliminary second dielectric layer 144PB is provided. At this time, the preliminary second dielectric layer 144PB may be diffused and repositioned, and thus, may be disposed to surround the grain boundary 142GB of the first dielectric layer 142B.

In example embodiments, the annealing process P40B may be performed by using a rapid thermal annealing process, a thermal annealing process such as a furnace annealing process, a plasma annealing process, and a laser annealing process. The annealing process P40B may be performed for several seconds to several hours at a temperature of about 100° C. to about 400° C. In example embodiments, the annealing process P40B may be performed in an atmosphere including an oxidant such as $O_2$, $O_3$, $H_2O_2$, or $N_2O$.

In the annealing process P40B, the preliminary second dielectric layer 144PB may be relatively easily diffused and repositioned through the grain boundary 142GB. The preliminary second dielectric layer 144PB may be disposed to surround an upper portion of a sidewall of the first dielectric layer 142B. The preliminary second dielectric layer 144PB may be disposed to surround the grain 142GR of the first dielectric layer 142B, and thus, the second dielectric layer 144B may be formed. The second dielectric layer 144B may include an upper surface which is disposed at a same level as an upper surface of the first dielectric layer 142B, and a surface roughness of the dielectric layer structure 140B may be reduced by the second dielectric layer 144B.

Figure 17:
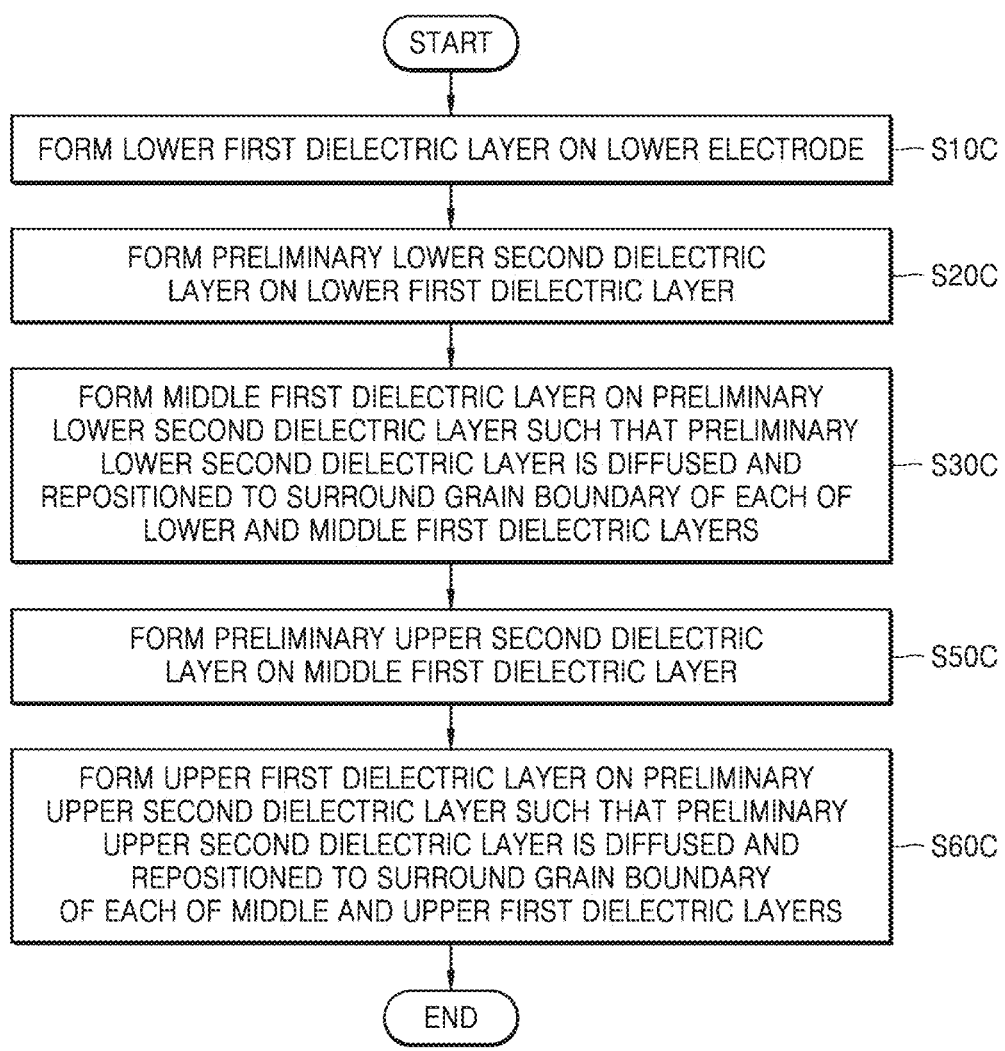
FIG. 17 is a flowchart illustrating a method of manufacturing an integrated circuit device, according to example embodiments.
Figure 18A:
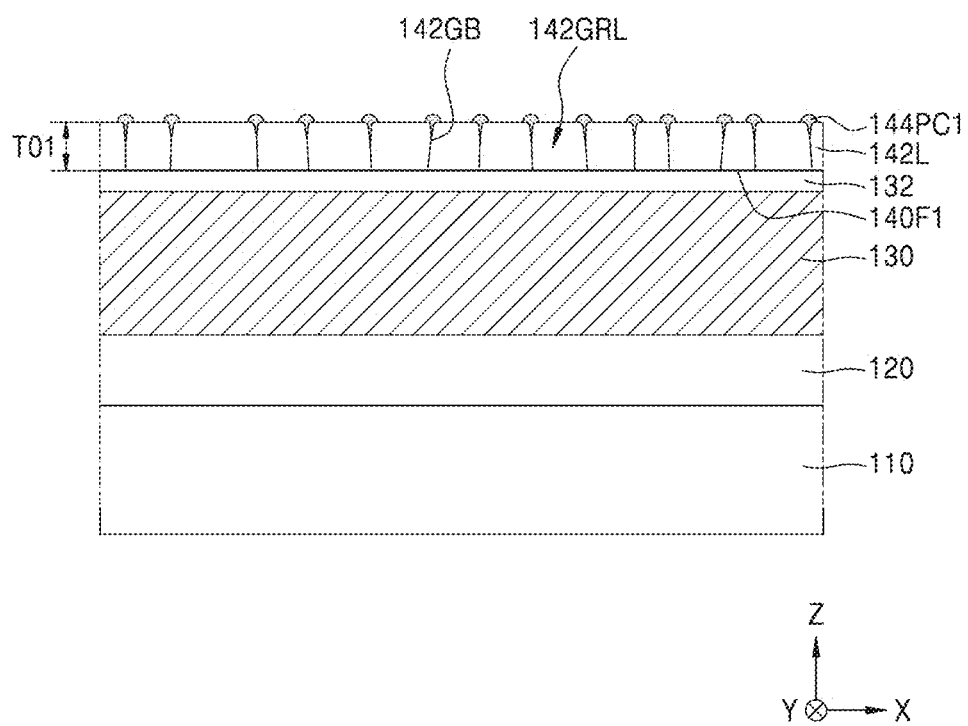
FIGS. 18A to 18C are cross-sectional views illustrating a method of manufacturing an integrated circuit device in a process sequence, according to example embodiments.
Figure 18B:
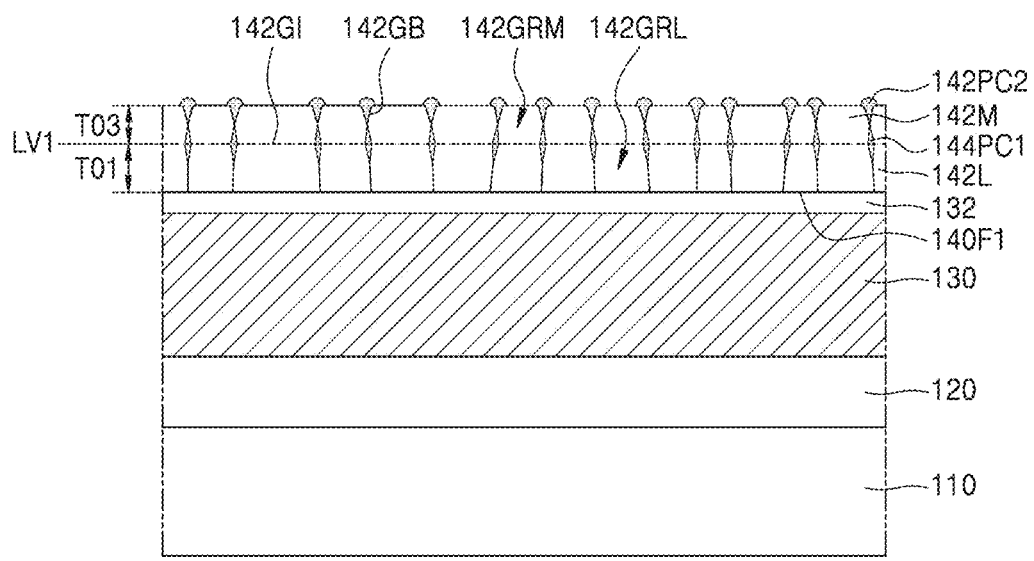
Figure 18C:
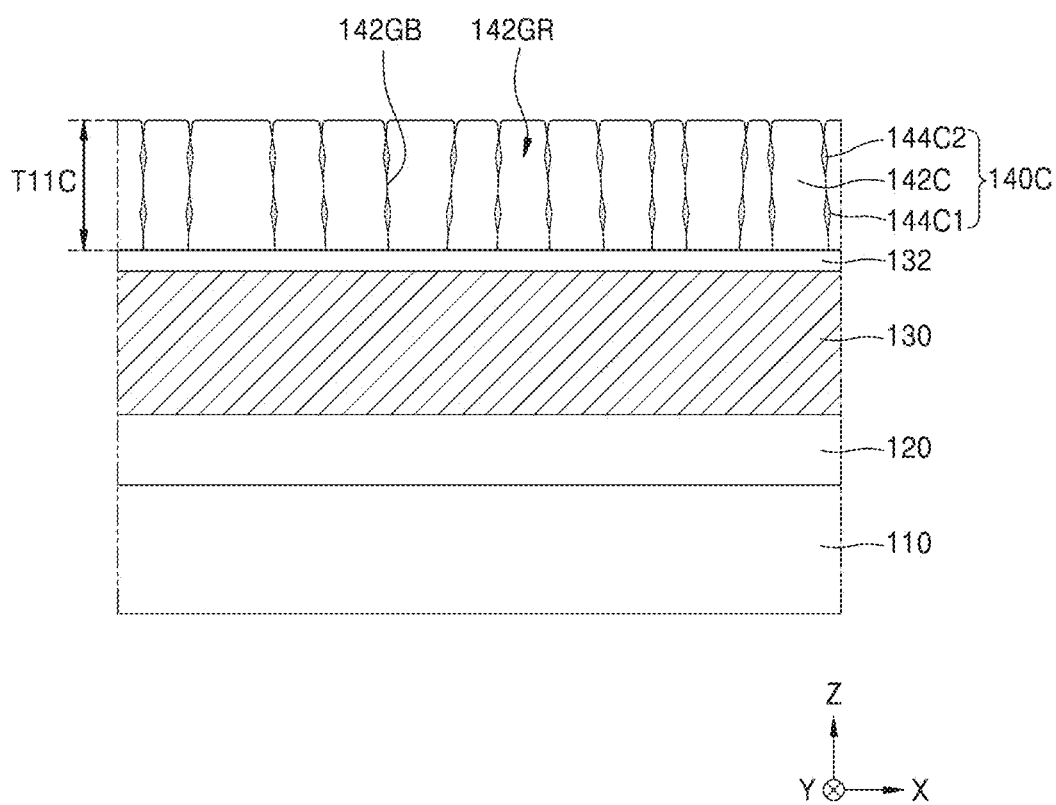

FIG. 17 is a flowchart illustrating a method of manufacturing an integrated circuit device 100C, according to example embodiments. FIGS. 18A to 18C are cross-sectional views illustrating a method of manufacturing the integrated circuit device 100C in a process sequence, according to example embodiments.

Referring to FIGS. 17 and 18A, in operation S10C, a lower first dielectric layer 142L may be formed on a lower electrode 130.

Subsequently, in operation 520C, a preliminary lower second dielectric layer 144PC1 may be formed on the lower first dielectric layer 142L.

Referring to FIGS. 17 and 18B, in operation 530C, a middle first dielectric layer 142M may be formed on the preliminary lower second dielectric layer 144PC1 and the lower first dielectric layer 142L. At this time, the preliminary lower second dielectric layer 144PC1 may be diffused and repositioned, and thus, may be disposed to surround a grain boundary 142GB of the lower first dielectric layer 142L and the middle first dielectric layer 142M. The middle first dielectric layer 142M may be formed to have a second thickness T03.

Subsequently, in operation 550C, a preliminary upper second dielectric layer 144PC2 may be formed on the middle first dielectric layer 142M.

Referring to FIGS. 17 and 18C, in operation 560C, an upper first dielectric layer 142U may be formed on the preliminary upper second dielectric layer 144PC2 and the middle first dielectric layer 142M. At this time, the preliminary upper second dielectric layer 144PC2 may be diffused and repositioned, and thus, may be disposed to surround a grain boundary 142GB of the middle first dielectric layer 142M and the upper first dielectric layer 142U (see FIG. 12C).

The lower, middle, and upper first dielectric layers 142L, 142M, and 142U may be formed to have the same crystalline alignment and may be connected to one another, thereby forming a first dielectric layer 142C including a plurality of grains 142GR. The plurality of grains 142GR may each include zirconium oxide having a tetragonal crystalline phase. A lower second dielectric layer 144C1 and an upper second dielectric layer 144C2 may be spaced apart from each other and disposed on a sidewall of each of the plurality of grains 142GR. Each of the preliminary lower second dielectric layer 144PC1 and the preliminary upper second dielectric layer 144PC2 may be disposed to surround at least a portion of a sidewall of each of the plurality of grains 142GR, and thus, the lower second dielectric layer 144C1 and the upper second dielectric layer 144C2 may be formed.

According to the above-describe manufacturing method, the first dielectric layer 142 may have good crystallinity with respect to a total thickness thereof, and the preliminary lower second dielectric layer 144PC1 and the preliminary upper second dielectric layer 144PC2 may effectively block a path of a leakage current flowing through a grain boundary 142GB of the first dielectric layer 142C. Accordingly, the dielectric layer structure 140 may have a reduced leakage current and/or may have an equivalent oxide thickness which is relatively small.

While the inventive concepts have been particularly shown and described with reference to embodiments thereof, it will be understood that various changes in form and details may be made therein without departing from the spirit and scope of the following claims.

What is claimed is:

1. A method of manufacturing an integrated circuit device comprising:
    forming a lower electrode on a substrate;
    forming a first dielectric layer on the lower electrode, the first dielectric layer including at least two grains and a grain boundary region that is disposed between the at least two grains, the first dielectric layer including a lower portion, an upper portion, and a middle portion that is disposed between the lower portion and the upper portion;
    forming a second dielectric layer in the first dielectric layer;
    forming an upper electrode on the first dielectric layer;
    forming a first interface layer that is disposed between the lower electrode and the first dielectric layer; and
    forming a second interface layer that is disposed between the first dielectric layer and the upper electrode,
    wherein the second dielectric layer is formed in the grain boundary region of the middle portion of the first dielectric layer such that a width of the second dielectric layer in the middle portion is greater than a width of the second dielectric layer in at least one of the upper or lower portions when viewed in cross section,
    the lower electrode includes titanium nitride,
    the first interface layer includes titanium oxide and niobium oxide,
    the first dielectric layer includes hafnium oxide and zirconium oxide,
    the second dielectric layer includes aluminium oxide,
    the second interface layer includes titanium oxide, and
    the upper electrode includes titanium nitride.

2. The method of claim 1, wherein the first interface layer further includes at least one of tantalum oxide, molybdenum oxide, iridium oxide, titanium oxynitride, tantalum oxynitride, niobium oxynitride, or molybdenum oxynitride.

3. The method of claim 1, wherein the second interface layer further includes at least one of tantalum oxide, niobium oxide, molybdenum oxide, iridium oxide, titanium oxynitride, tantalum oxynitride, niobium oxynitride, or molybdenum oxynitride.

4. The method of claim 1, wherein each of the lower electrode and the upper electrode further includes at least one of ruthenium, tantalum, niobium, iridium, molybdenum, tungsten, tantalum nitride, niobium nitride, molybdenum nitride, tungsten nitride, iridium oxide, ruthenium oxide, or strontium ruthenium oxide.

5. The method of claim 1, wherein the first dielectric layer further includes at least one titanium oxide, niobium oxide, tantalum oxide, yttrium oxide, strontium titanium oxide, barium strontium titanium oxide, scandium oxide, or lanthanons oxide.

6. The method of claim 1, wherein the second dielectric layer further includes at least one of boron oxide, gallium oxide, or indium oxide.

7. The method of claim 1, wherein the grain boundary region extends in a direction perpendicular to a top surface of the lower electrode.

8. The method of claim 1, wherein a thickness of the first dielectric layer, in a direction perpendicular to a top surface of the lower electrode, is greater than a thickness of the second dielectric layer in the direction perpendicular to the top surface of the lower electrode.

9. A method of manufacturing an integrated circuit device comprising:

forming a lower electrode on a substrate;

forming a lower portion of a first dielectric layer on the lower electrode, the lower portion of the first dielectric layer including a plurality of grains;

forming an upper portion of the first dielectric layer on the lower portion of the first dielectric layer, the upper portion of the first dielectric layer including a plurality of grains;

forming a second dielectric layer between the lower portion and the upper portion of the first dielectric layer;

forming an upper electrode on the upper portion of the first dielectric layer;

forming a first interface layer that is disposed between the lower electrode and the lower portion of the first dielectric layer; and forming a second interface layer that is disposed between the upper portion of the first dielectric layer and the upper electrode, wherein the second dielectric layer is formed in a grain boundary region between the lower portion and the upper portion of the first dielectric layer such that a width of the second dielectric layer in the middle portion is greater than a width of the second dielectric layer in at least one of the upper or lower portions when viewed in cross section, the lower electrode includes titanium nitride, the first interface layer includes titanium oxide and niobium oxide, each of the lower portion and the upper portion of the first dielectric layer includes hafnium oxide and zirconium oxide, the second dielectric layer includes aluminium oxide, the second interface layer includes titanium oxide, and the upper electrode includes titanium nitride.

10. The method of claim 9, wherein the grain boundary region extends in a direction perpendicular to a top surface of the lower electrode.

11. The method of claim 9, wherein a thickness of the second dielectric layer is less than a total thickness of the lower portion and the upper portion of the first dielectric layer in a direction perpendicular to a top surface of the lower electrode.

12. A method of manufacturing an integrated circuit device comprising:

forming a lower electrode on a substrate;

forming a first dielectric layer on the lower electrode, the first dielectric layer including at least two grains and a grain boundary region that is disposed between the at least two grains, the first dielectric layer including a lower portion, an upper portion, and a middle portion that is disposed between the lower portion and the upper portion;

forming a second dielectric layer in the first dielectric layer;

forming a third dielectric layer on the upper portion of the first dielectric layer;

forming an upper electrode on the third dielectric layer;

forming a first interface layer that is disposed between the lower electrode and the first dielectric layer; and forming a second interface layer that is disposed between the third dielectric layer and the upper electrode, wherein the second dielectric layer is formed in the grain boundary region of the lower portion of the first dielectric layer and a width of the second dielectric in the lower portion of the first dielectric layer is greater than a width of the second dielectric in the middle portion when viewed in cross section, the lower electrode includes titanium nitride, the first interface layer includes titanium oxide and niobium oxide, the first dielectric layer includes hafnium oxide and zirconium oxide, the second dielectric layer includes aluminium oxide, the third dielectric layer includes at least one of boron oxide, aluminium oxide, gallium oxide, indium oxide, or beryllium oxide, the second interface layer includes titanium oxide, and the upper electrode includes titanium nitride.

13. The method of claim 12, wherein the grain boundary region extends in a direction perpendicular to a top surface of the lower electrode.

* * * * *